(12) United States Patent
Chen

(10) Patent No.: US 9,793,503 B2
(45) Date of Patent: Oct. 17, 2017

(54) NANOSTRUCTURED ORGANIC MEMRISTOR/MEMCAPACITOR OF MAKING WITH AN EMBEDDED LOW-TO-HIGH FREQUENCY SWITCH AND A METHOD OF INDUCING AN ELECTROMAGNETIC FIELD THERETO

(71) Applicant: Ellen Tuanying Chen, Rockville, MD (US)

(72) Inventor: Ellen Tuanying Chen, Rockville, MD (US)

( * ) Notice: Subject to any disclaimer, the term of this patent is extended or adjusted under 35 U.S.C. 154(b) by 0 days.

(21) Appl. No.: 14/919,606

(22) Filed: Oct. 21, 2015

(65) Prior Publication Data
US 2016/0155972 A1 Jun. 2, 2016

Related U.S. Application Data

(60) Provisional application No. 62/067,394, filed on Oct. 22, 2014, provisional application No. 62/067,212, filed on Oct. 22, 2014.

(51) Int. Cl.
*H01L 51/05* (2006.01)
*H01L 51/00* (2006.01)

(52) U.S. Cl.
CPC ...... *H01L 51/0591* (2013.01); *H01L 51/0093* (2013.01)

(58) Field of Classification Search
CPC .............. H01L 51/0591; H01L 27/285; H01L 51/0043; H01L 51/004; H01L 51/005; H01L 51/0093
See application file for complete search history.

(56) References Cited

U.S. PATENT DOCUMENTS

| | | | |
|---|---|---|---|
| 8,488,247 B2* | 7/2013 | Cai | F41H 3/00 359/642 |
| 9,134,465 B1* | 9/2015 | Cohen | G02B 5/008 |
| 2014/0197379 A1* | 7/2014 | Li | H01L 51/5262 257/40 |

* cited by examiner

*Primary Examiner* — Roy Potter

(57) ABSTRACT

An organic memresitor/memcapacitor comprises of two terminal electrodes, each electrode has a membrane made of nanostructure organic conducting polymer of cyclodextrin derivatives attached thereto. By self assembling of cross-linking copolymers forming conductive membranes and separated by a mobile dopant barrier dielectric material, one side of the membrane has structure formed flat horizontal nano-bridges with array larger vertical nanopores underneath the bridge; and another side of the electrode/membrane has a negative mobile dopant polymer network forming arrays nano-islands with the membrane thickness is one third of the opposite membrane to be feasible conducting "head-tail" biphase charge and discharge at wide range of frequencies, so called the low-to-high frequency switch embedded to effectively save energy and storage energy by utilizing functional groups mimicking the positive and negative isopotential poles active sites of the acetylcholinesterase (ACHE) gorge along strengthened by a hydrophobic reagent. This invention also disclosed a method to build an organic Memristor/Memcapacitor having no hydrophobic reagent applied to lining the ACHE gorge and hence it induced an electromagnetic field that was not able to have biphase charge/discharge in an organic media.

19 Claims, 38 Drawing Sheets

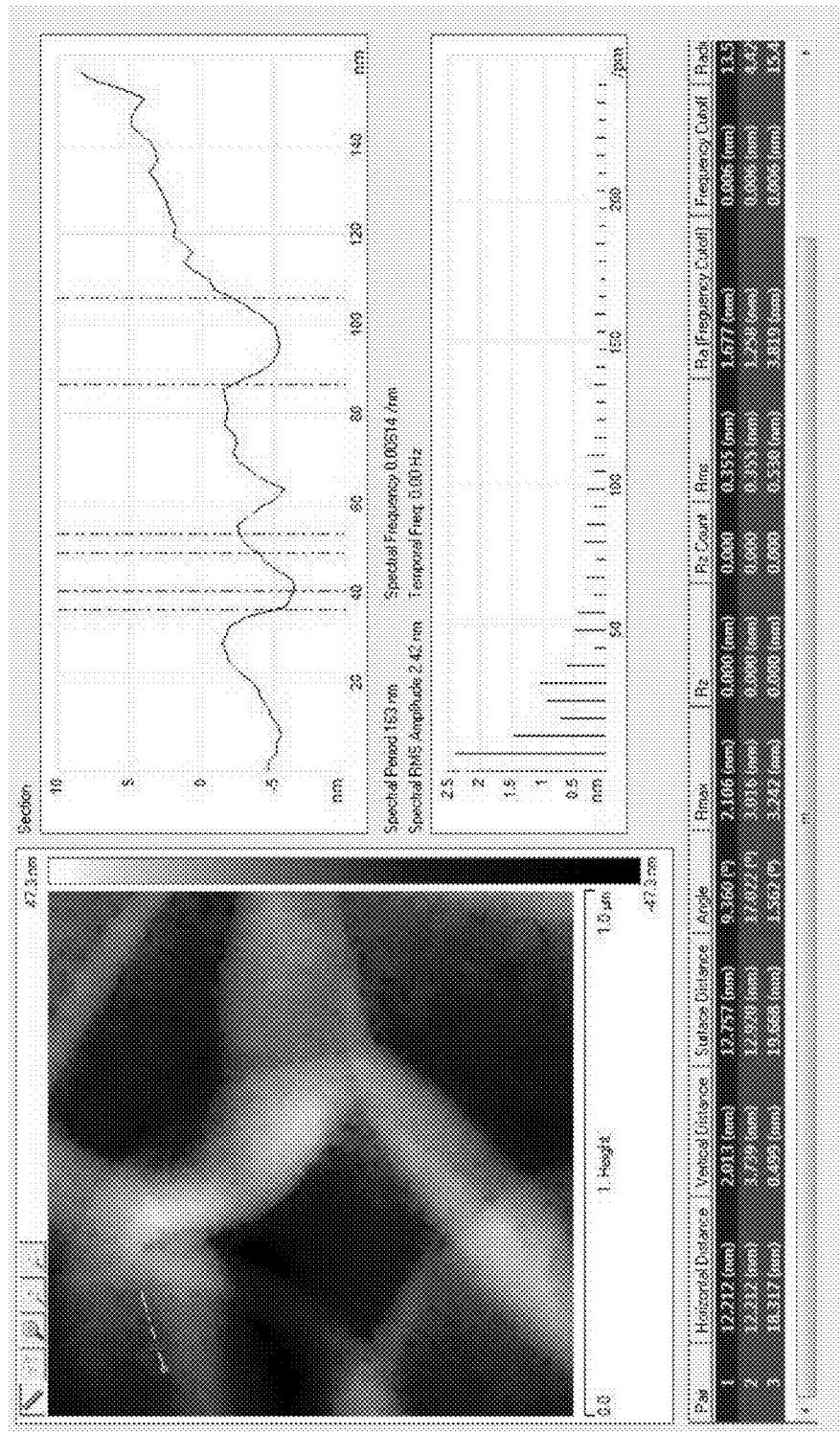
Fig 1A, Cross Section Analysis

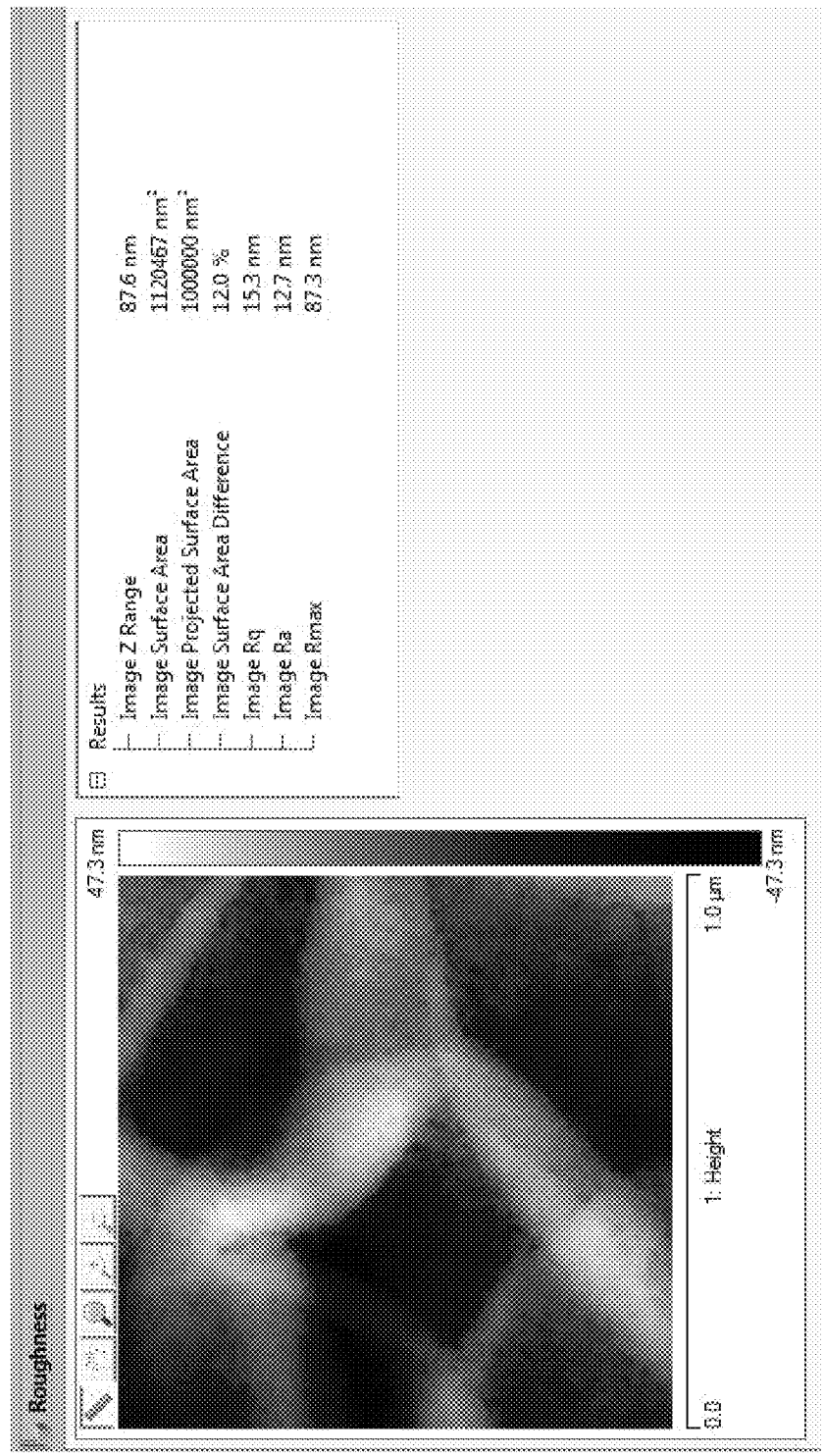

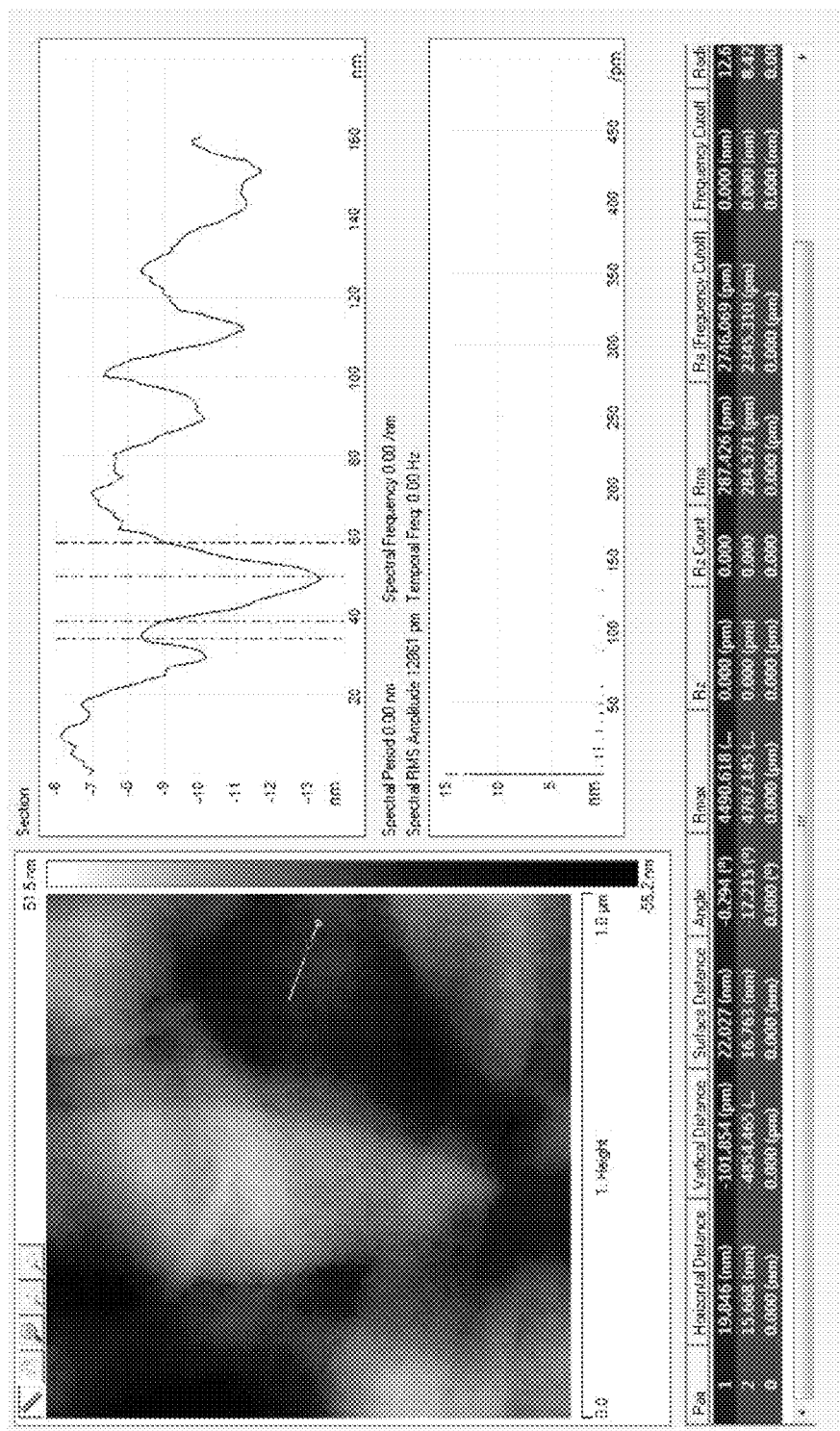

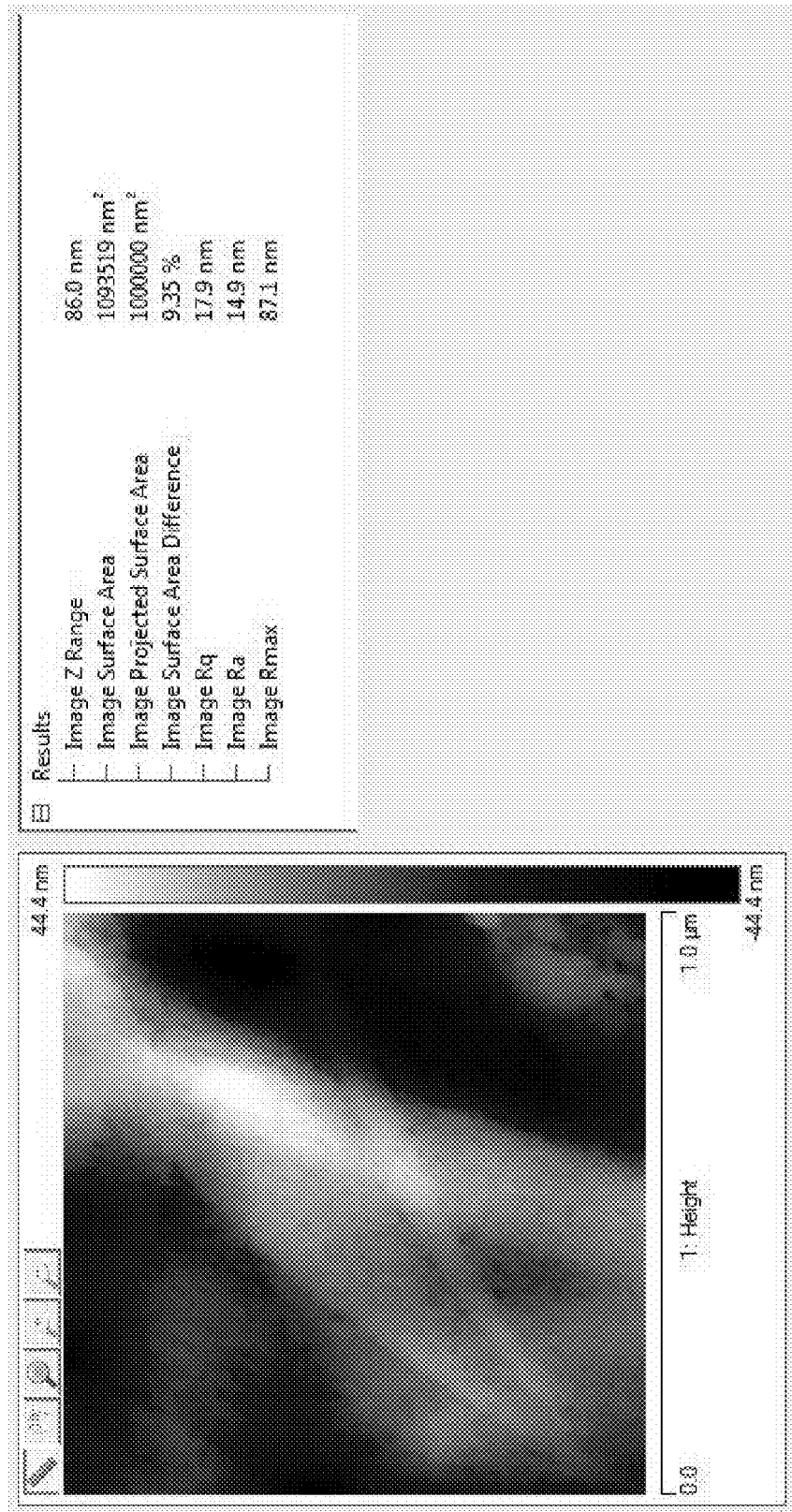

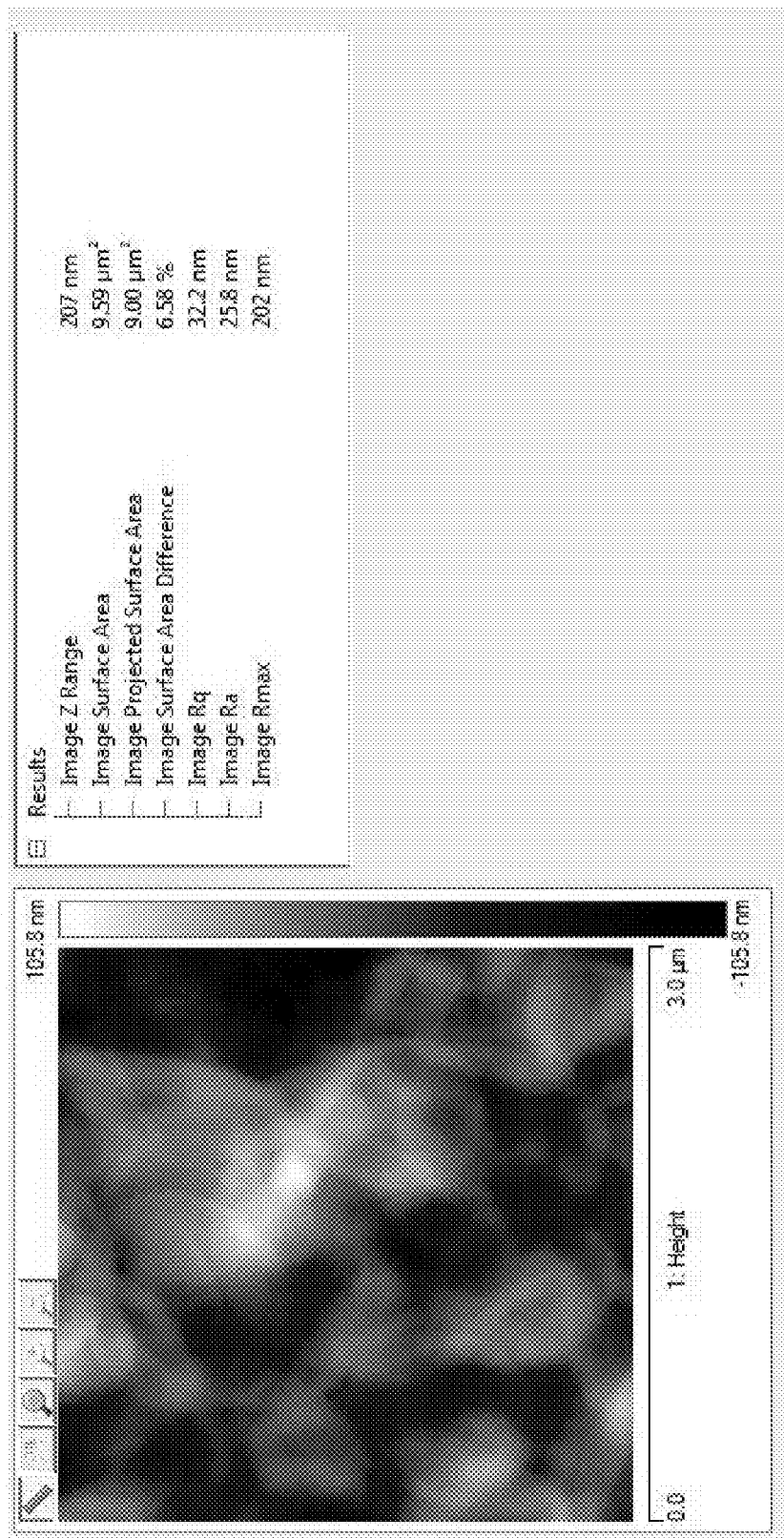

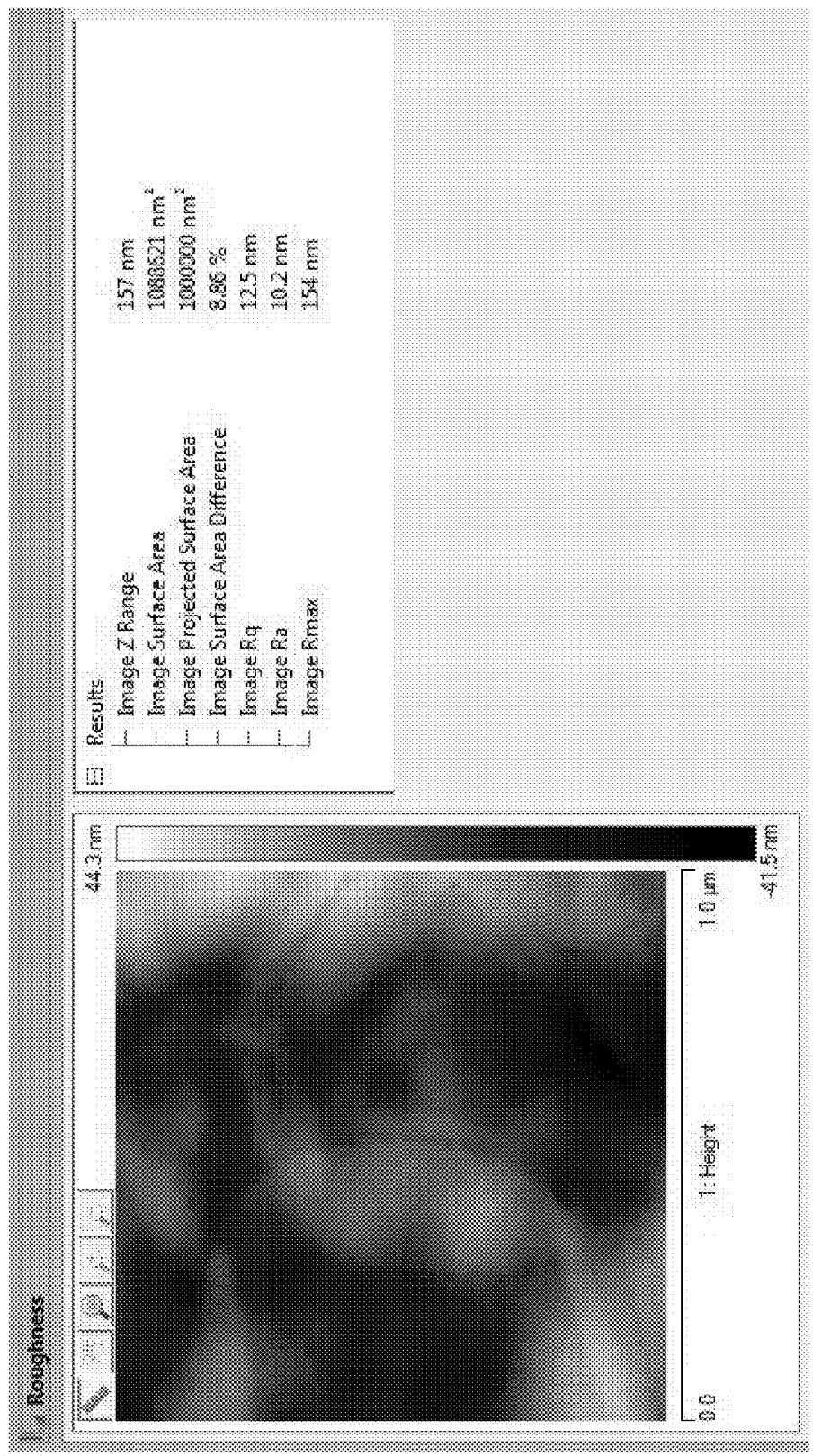

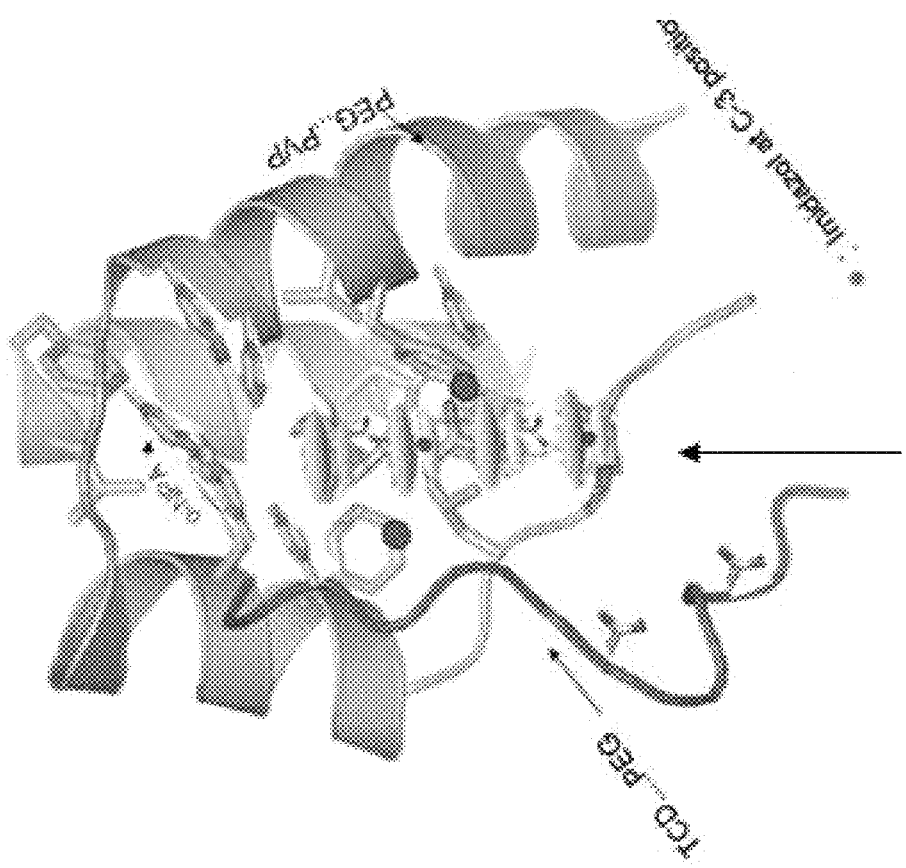

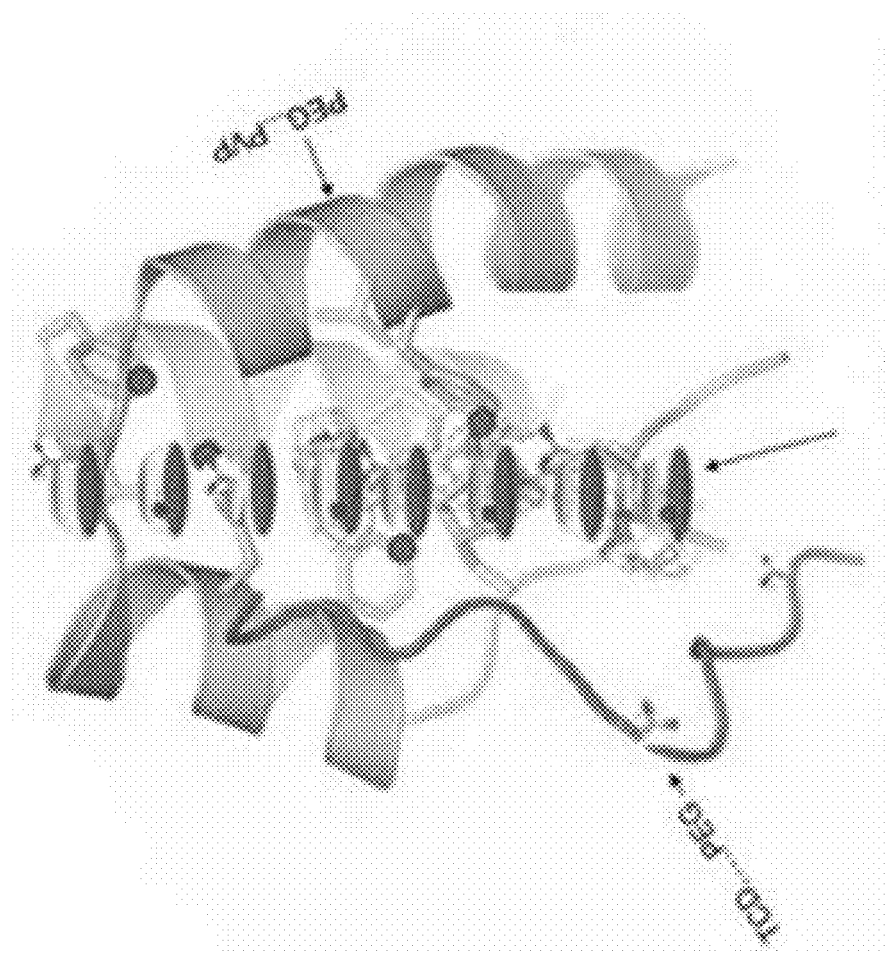

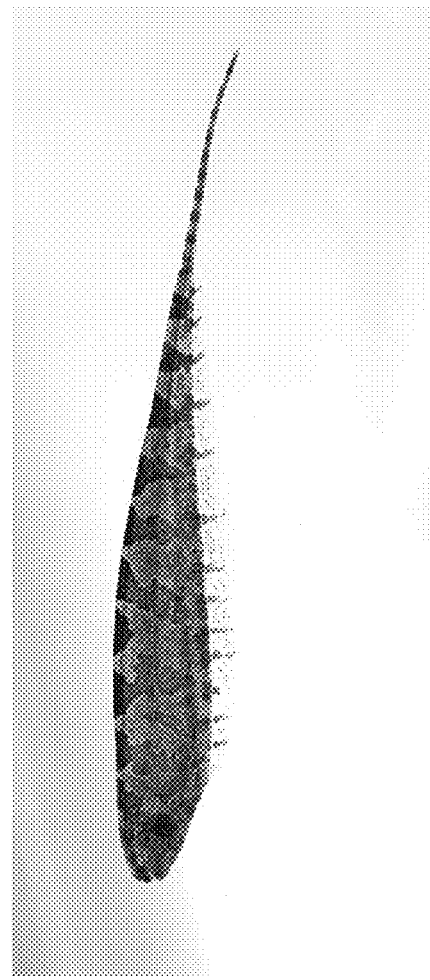
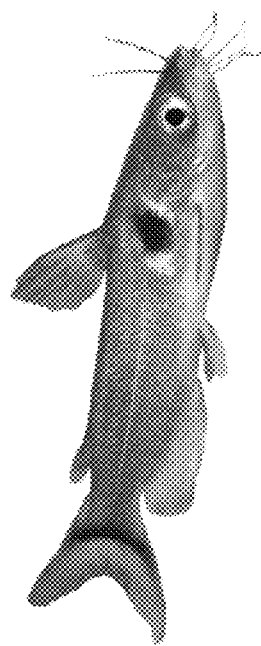
Fig. 7A
Fig. 7B

NANOSTRUCTURED ORGANIC MEMRISTOR/MEMCAPACITOR OF MAKING WITH AN EMBEDDED LOW-TO-HIGH FREQUENCY SWITCH AND A METHOD OF INDUCING AN ELECTROMAGNETIC FIELD THERETO

FIELD OF THE INVENTION

This patent application claims the benefit of U.S. Provisional Patent Application Ser. No. 62/067,394 filed on Oct. 22, 2014 and Provisional Patent Application Ser. No. 62/067,212 filed on Oct. 22, 2014. The entire disclosures of the prior Patent Application Ser. Nos. 62/067,394 and 62/067,212 are hereby incorporated by reference, as is set forth herein in its entirety.

BACKGROUND OF THE INVENTION

*Brachyhypopomus* Electric (BHE) fish is known for its signal-cloaking behavior that allows it to avoid predators by shifting its electroreceptive pulses from low frequency to less detectable high-frequency through a phase-delay "head-tail" Electric Organ Discharge (EOD) with an energy saving consumption [1-3]. The BHE fish signal-cloaking strategy produces broad frequency electric field close to the body, causing its low frequency field to be cancelled by the local field, hence the predators are unable to find them. There is a risk of releasing huge amounts of heat during electrical discharge by the metal oxide thermal memcapacitors. This causes reduction in energy converting efficiency and is not beneficial for energy storage or for computing purposes. Special features of memcapacitors in negative and diverging capacitance received attention in the memristor/mamcapacitor society [16-17]. Martinez-Rincon's group published an article emphasizing the utility of negative and diverging capacitance in computing: "The resulting memcapacitor exhibits not only hysteretic charge-voltage and capacitance-voltage curves but also both negative and diverging capacitance within certain ranges of the field, due to its simplicity and unusual capacitance features. We expect it to find use in both analog and digital applications." [17]. Our group developed the first nanomemcapcitor with negative and diverging capacitance made of non metal oxide materials and reached a superior performance in plasticity, elasticity, stability and high power and energy density without environmental pollution and current leaking [6-7].

Circular current induced by junctions of aromatic molecules of the delocalized molecules has drawn interest from theoretical scientists [18-19]. Scientists have envisioned its future applications. The goal of this research is to develop a memcapacitor device that performs signal-cloaking, which mimics BHE's behavior saving operational energy and enhancing the energy storage under the conditions of electrolyte-free, nature ACHE-free, metal oxide-free and reagent-free.

SUMMARY OF THE INVENTION

It is an object of the present invention to provide a new generation of memristor/memcapacitor that embodiments with characteristics of both types of devices.

It is an object of the present invention to provide a new generation of memristor/memcapacitor that was not made by any metal oxide, but of biomimetic organic cross-linked polymer membrane that mimics a normal cylindrical confined acetylecholenesterase (ACHE) eternal gorge as a "normal brain" prosthesis model with a "biomimetic linen" attached in the gorge thereto.

It is an object of the present invention to provide a new generation of memristor/memcapacitor device with new method of making with an embedded Low-to-high frequency switch for saving energy and effectively storage energy.

It is an object of the present invention to provide a new generation of memristor/memcapacitor device that comprises of an biomimetic organic polymer membrane that mimics a mutated acetylecholenesterase (ACHE) eternal gorge with 14 hydrophobic residues groups knocked out, serves as a "damaged brain" prosthesis model.

It is an object of the present invention to provide a new generation of organic Memristor/Memcapacitor having no hydrophobic reagent o-nitrophenyl acetate applied to the half-cell MEA compared with the o-NPA embedded in the half-cell MEA in order to study whether or not the disturbing circular current formed inducing an electromagnetic field strong enough to affect the Low- to High frequency switch.

BRIEF DESCRIPTION OF THE DRAWINGS

FIG. 1A shows three-dimensional atomic force microscopy (AFM) image of the nanostructured biomimetic "Mutated ACHE Gorge" with a vertical bridge and the cross section analysis results were shown in the table listed below. FIG. 1B is the AFM of the Biomimetic "Mutated ACHE Gorge" bridge specifications and the array 3D lattices. The roughness measurements Peak-to-Valley (Z range), and the Root Mean Square (RMS), and Average Roughness ($R_a$) are also shown for this image. FIG. 1C shows the 2D AFM image of the vertical bridge deepness in cross section analysis; FIG. 1E shows the enlarged AFM of the bridge surface of the cross-section analysis and FIG. 1F is the AFM specifications of the bridge surface. FIG. 1G shows the specifications of the nanoporous existing near the bridge on the surface of the membrane.

FIG. 2F shows the enlarged AFM of the nanopore nearby the bridge for the cross-section analysis and FIG. 2G depicts the AFM results specifications of the nanoporous.

FIG. 4A depicts the art illustration of the SAM molecular polymer architecture for memristor sensor 1 as the model for a "normal ACHE Gorge". FIG. 4B depicts the art illustration of the SAM molecular polymer architecture for memristor sensor 2 as the model for a "Mutated ACHE Gorge".

FIG. 7A depicts the image of the BHE fish. FIG. 7B depicts the image of the catfish as "Predator".

DETAILED DESCRIPTION OF THE INVENTION

Example 1

Fabrication of the Nanostructured Biomimetic Self-Assembling Membranes (SAM) (Literature is Right)

The nanostructured biomimetic ACHE SAM with the vertical bridged conformational "Mutated ACHE Gorge" was freshly prepared. Polyethylene glycol diglycidyl ether (PEG), triacetyl-β-cyclodextrin (T-CD), poly(4-vinylpyridine) (PVP) were purchased from Sigma. PVP was purified before use. The mono derivative dimethyl β-cyclodextrin named as (mM-β-DMCD) was generally synthesized according to the published procedures [20]. The appropriate amount of solutions of individual polymer and reagents were prepared [8]. The mixture solution was made up by mM-β-DMCD (2 g/L to 2.5 g/L, T-CD 2-3 mM, PEG 2 g/L-3 g/L and PVP (40 mg/dL-80 mg/dL), the mixture was incubated in 37 C for 2-3 hrs, then added 0.02M o-NPA with the molar ratio to TCD in the range of (500-1000):1 to the mixture for device 1 with a flat membrane with nanopores. The vertical bridge membrane with nanopores for device 2 did not apply o-NPA. The Au electrode has 50 nm thicknesses and 3 mm in diameter. The mixture solution was injected onto the surface of the electrode and was incubated for 48 hrs at an incubator. After that, the further clean and incubating procedures were followed.

The nanostructured biomimetic "Normal ACHE Gorge" neuronal network SAM with the flat bridged conformation, nanopores and lattices was freshly prepared by adding appropriate amount of o-nitrophenyl acetate (o-NPA) into the above described mixture solution for construction of the vertical bridged ACHE SAM.

Example 2

AFM Measurements

Figure 1D:
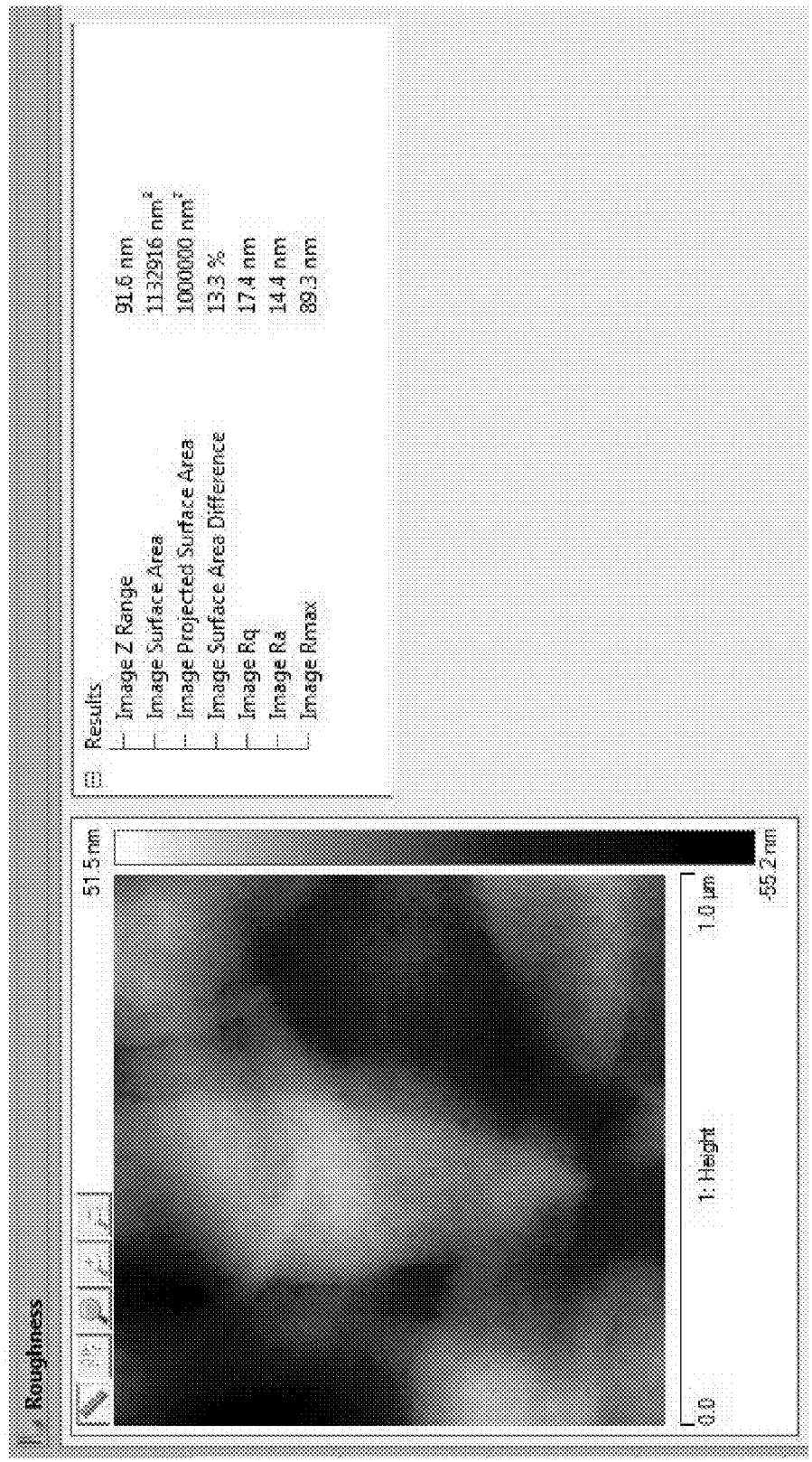
FIG. 1D shows the AFM specification of the surface roughness.
Figure 1E:
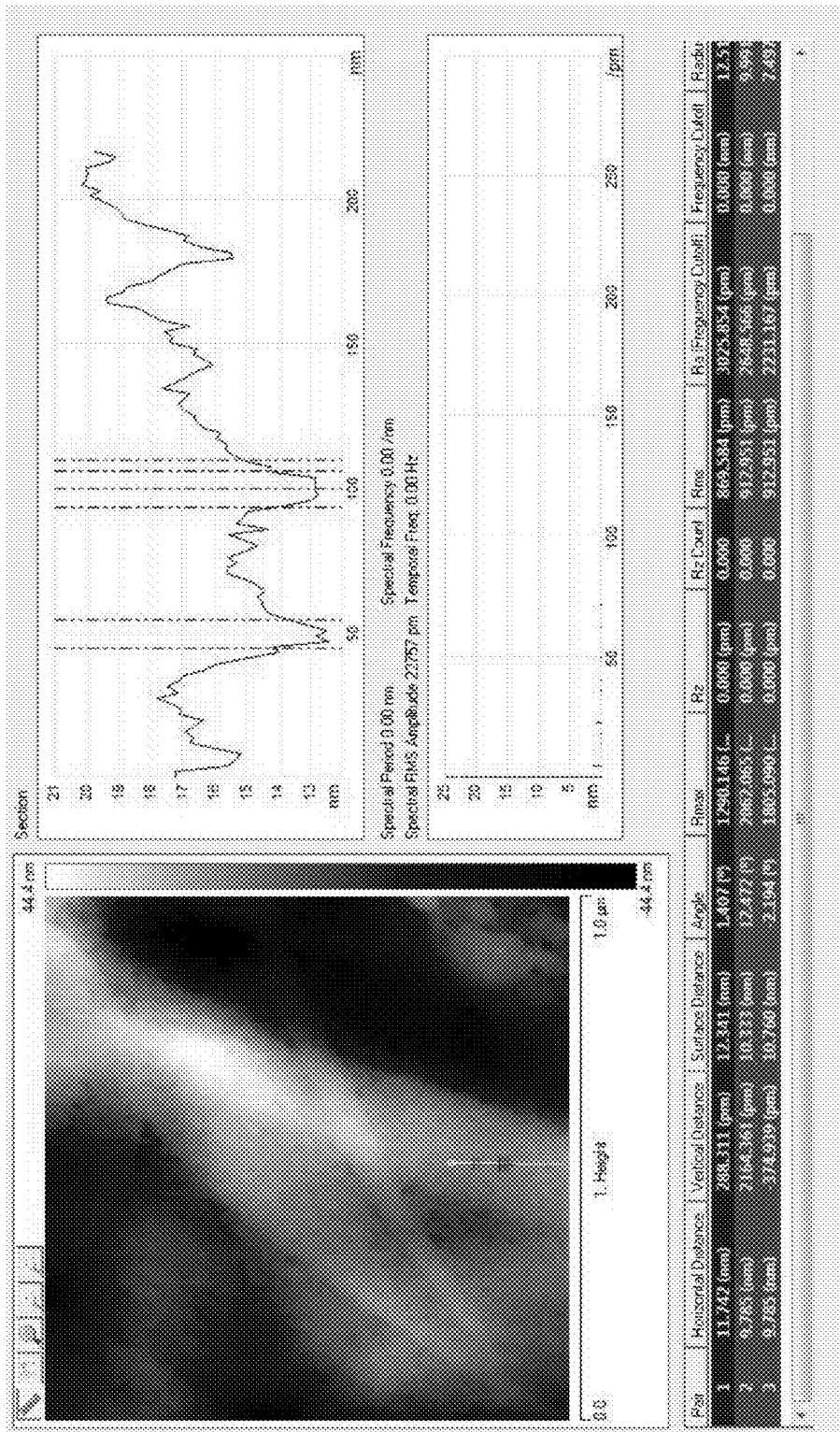

The morphology of the three CD-SAMs were characterized by using an instrument (model Multimode 8 ScanAsyst, Bruker, Pa.). Data collected in PeakForce Tapping Mode. Probes used were ScanAsyst-air probes (Bruker, Pa.). The silicon tips on silicon nitride cantilevers have 2-5 nm radius. The nominal spring constant 0.4 N/m was used. NanoScope Analysis v1.40r2 software was used. FIG. 1A illustrates the vertical conformational AFM image of ACHE bridge structure by cross analysis. The average "breathing pore" vertical height by cross section analysis is 3.74 nm with the pore width of 12.2-18 nm and the RMS (surface morphology) is 3.55 nm. The lattice distributed pores can be seen in the image. The bridge vertical height is 47.3 nm with the length of 940 nm. FIG. 1B illustrates the membrane specifications in roughness is 15.2 nm and the membrane surface thickness is 47.3 nm. FIG. 1C shows the bridge vertically oriented of 51.5 nm, underneath of the bridge is the "breath pore" with pore diameter of 15-20 nm and depth of 0.5 nm and the surface roughness is 0.287 nm. FIG. 1D shows the membrane surface roughness is 17.4 nm. FIG. 1E shows the AFM image of the shining horizontal cross bar associated with the vertical bridge of FIG. 1A. The cross bar channel width is 200-600 nm and height is 44.4 nm, and length is 1100 nm. Underneath of the bridge are "breathing pores" of 0.2 nm in depth and 10-12 nm in diameter with RMS value 0.9 nm. FIG. 1F shows the membrane surface morphology in 17.9 nm. FIG. 1G shows the AFM in a larger window view of 9 $\mu m^2$ and we can see the breathing pores distributed evenly filled inside of each orderly square lattices and the bridges are on top with a vertical fall difference of 50-100 nm.

Figure 2A:
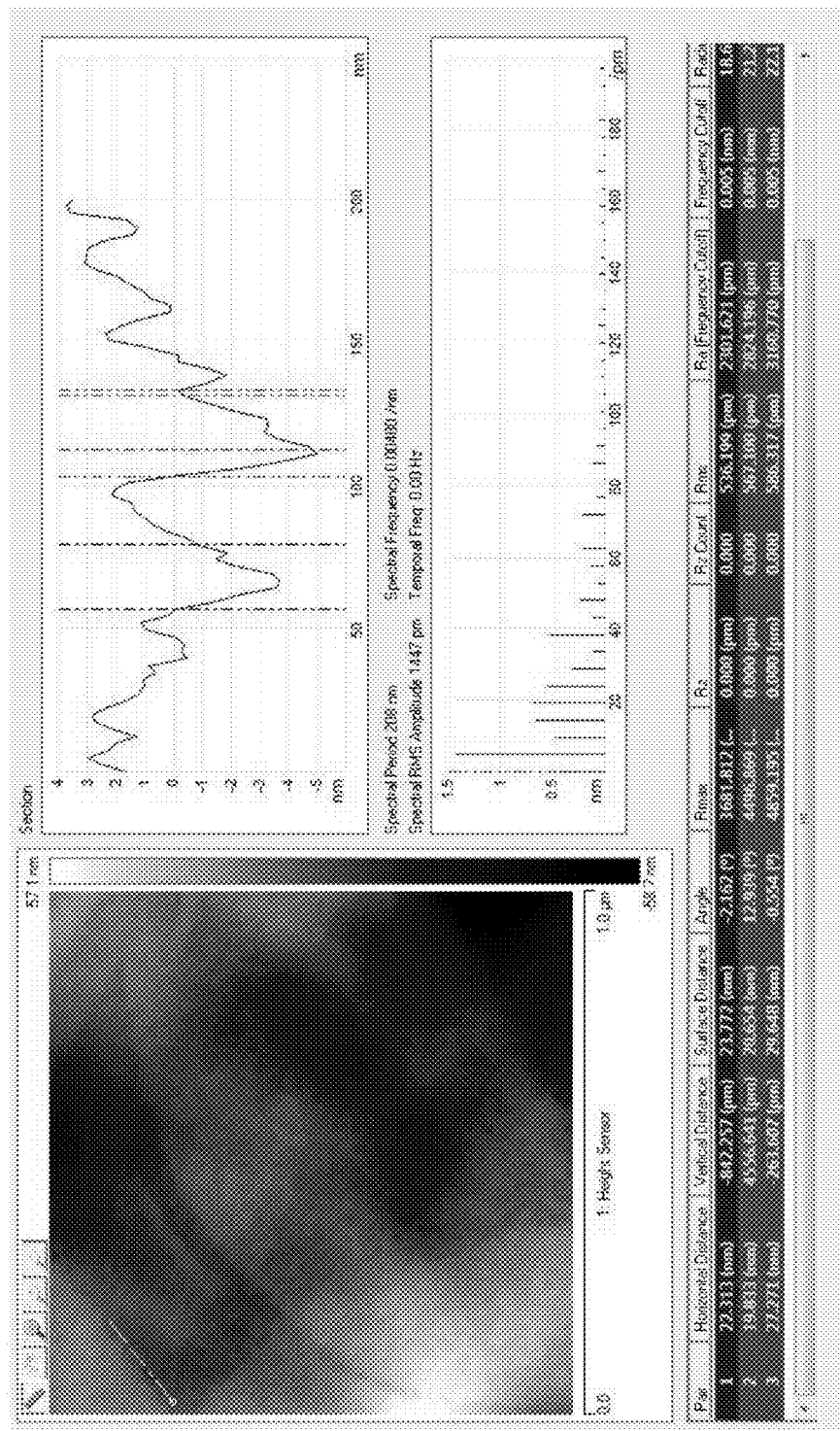
FIG. 2A shows the AFM image of the nanostructured biomimetic "Normal ACHE Gorge" with a flat horizontal bridge and the cross section analysis results were shown in the table listed below.
Figure 2B:
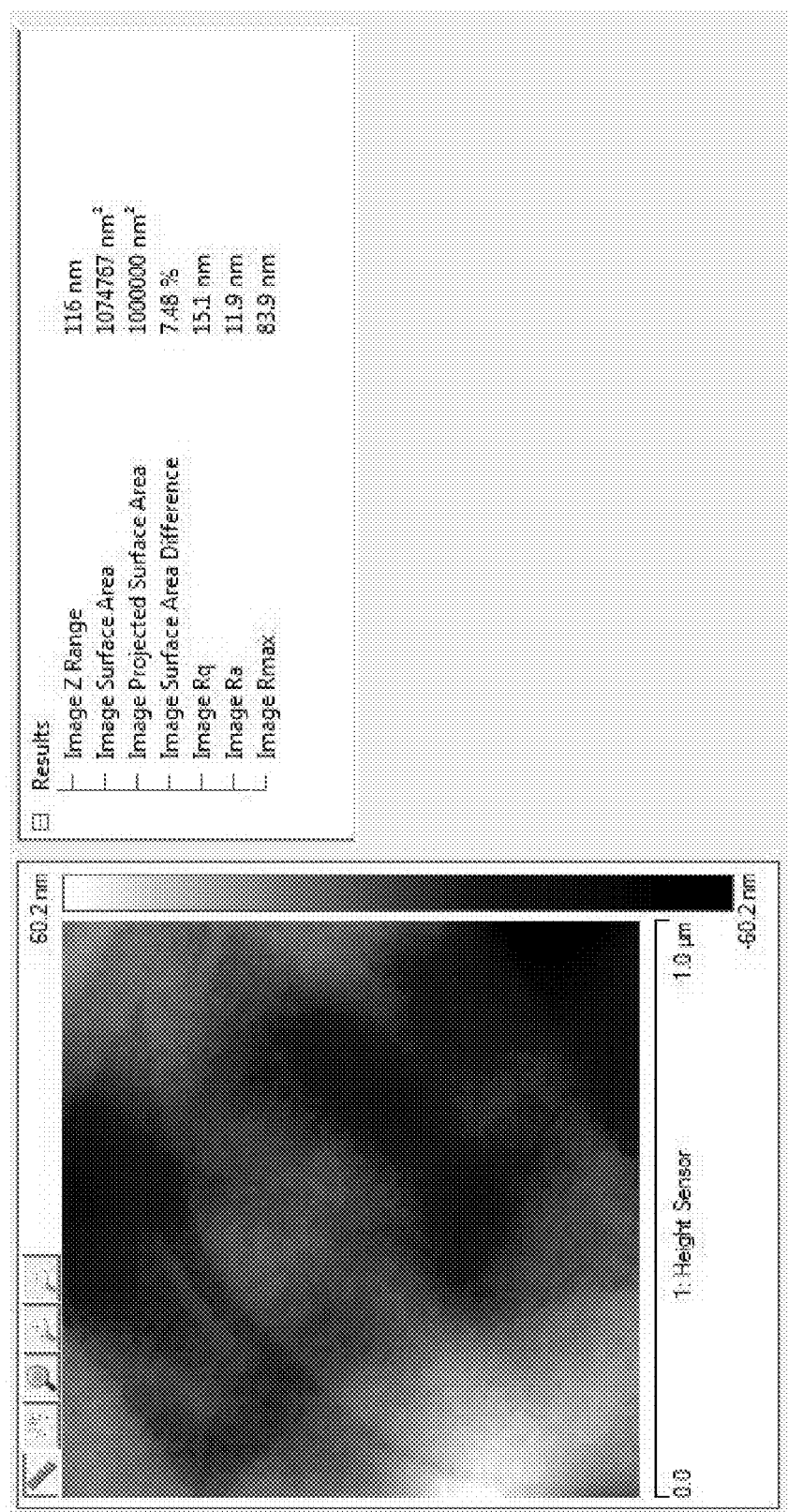
FIG. 2B is the AFM of the biomimetic "Normal ACHE Gorge" flat bridge specifications with the roughness values are also shown for this image.
Figure 2C:
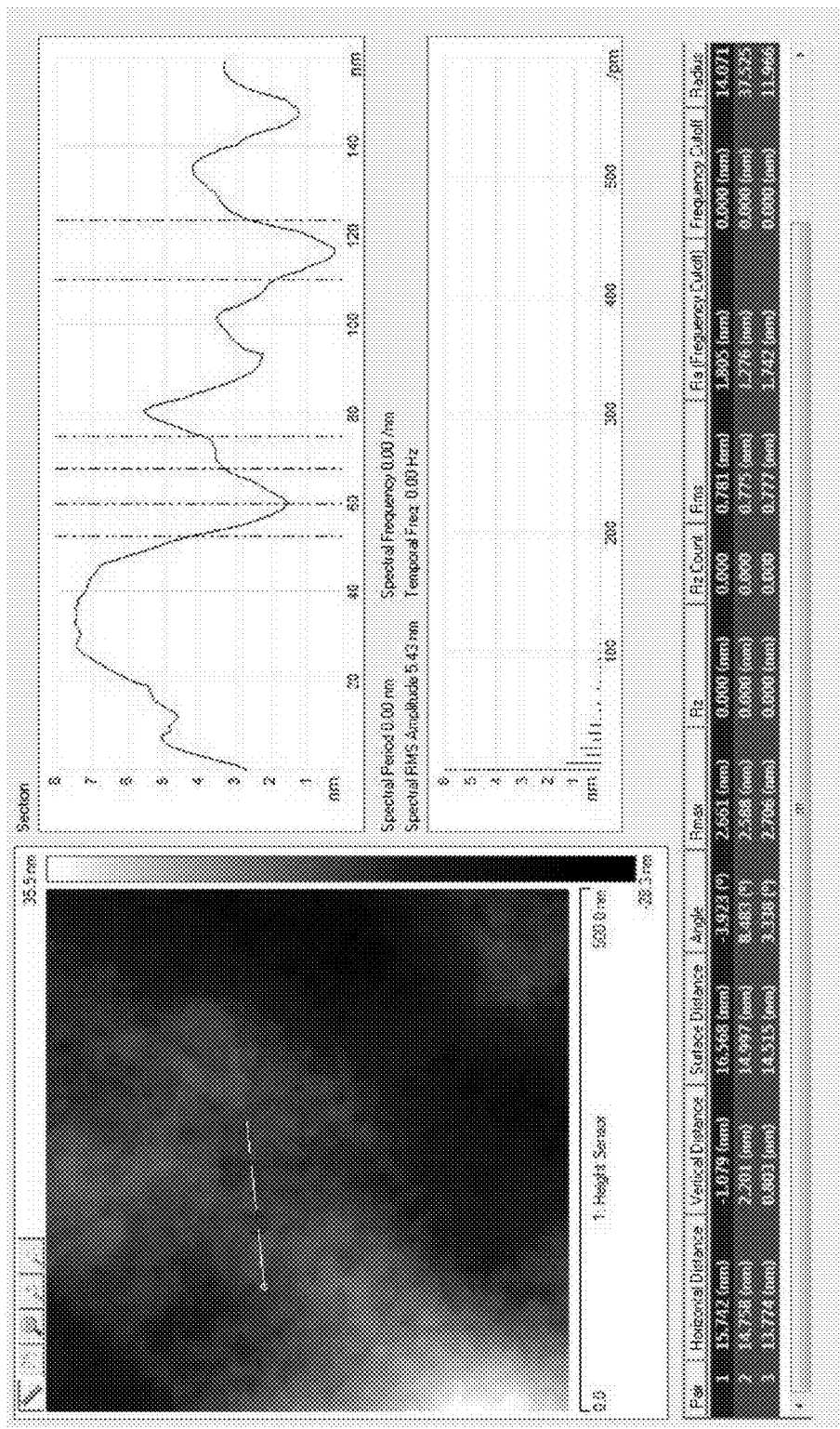
FIG. 2C shows the close look of the bridge surface in cross section analysis.
Figure 2D:
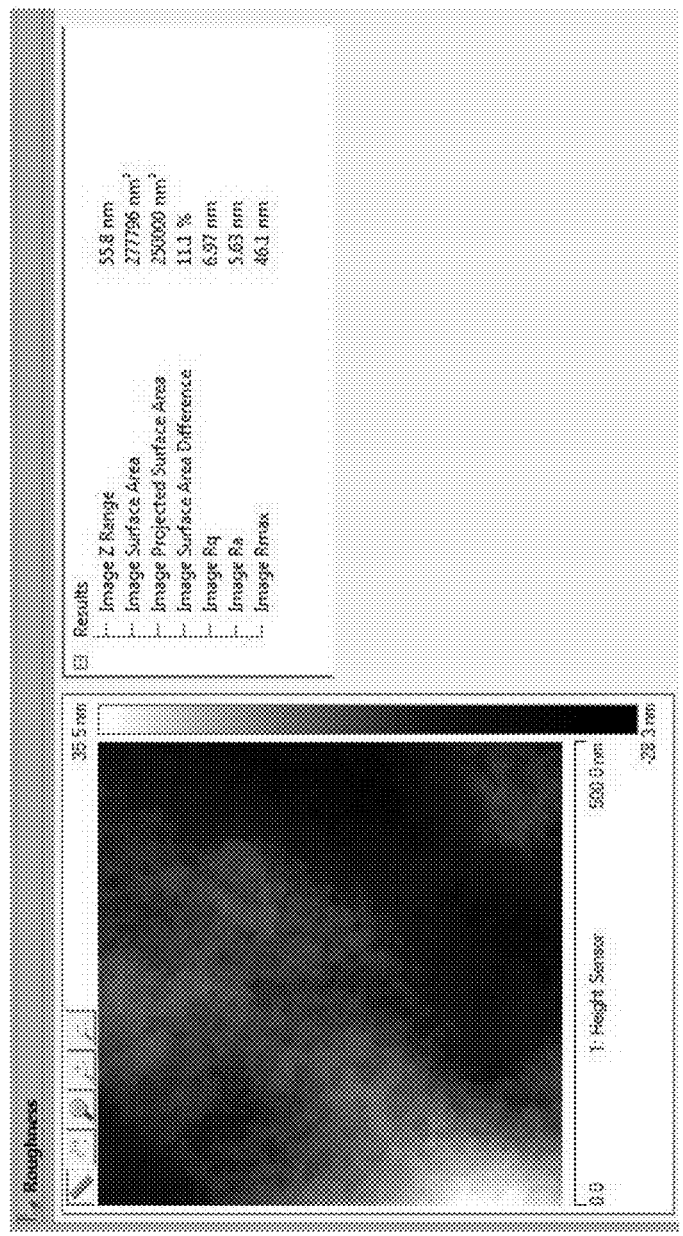
FIG. 2D shows the AFM specification of the surface roughness of the bridge.
Figure 2E:
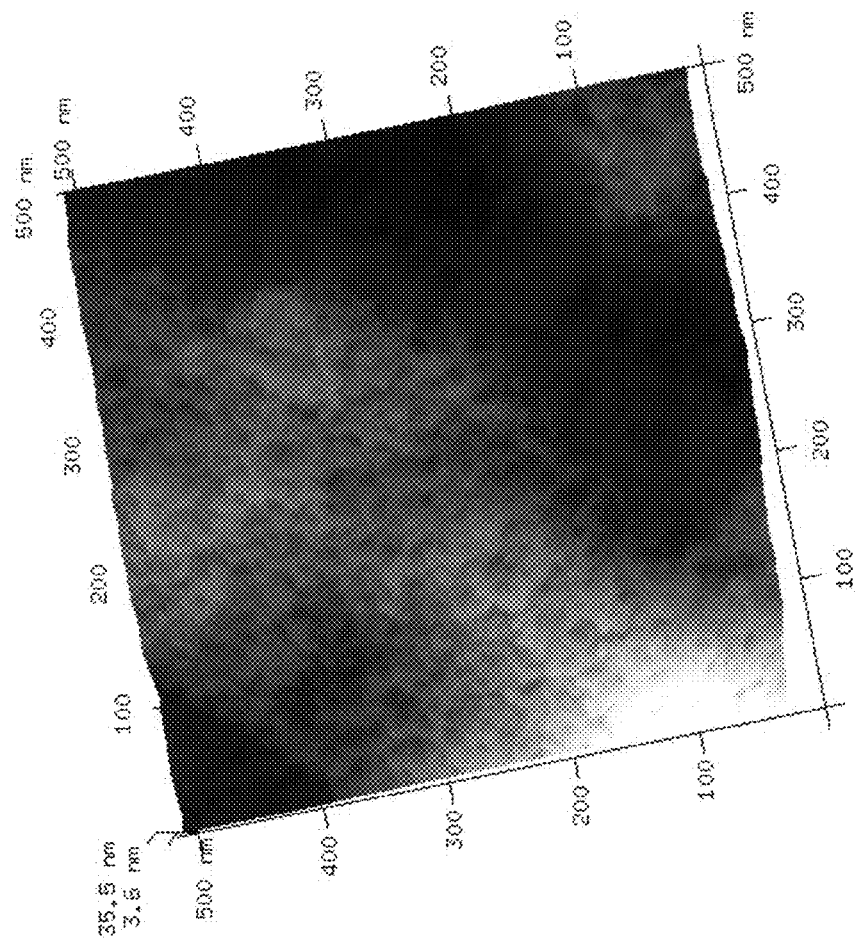
FIG. 2E depicts the body of the horizontal flat bridge was densely covered with thousands uniformly and orderly orientated donuts shaped "fish scales", density of $10^7$ pores/cm$^2$, with the average donuts size of 22 nm in diameter and the pores in the center are 9-10 nm in diameter.
Figure 2F:
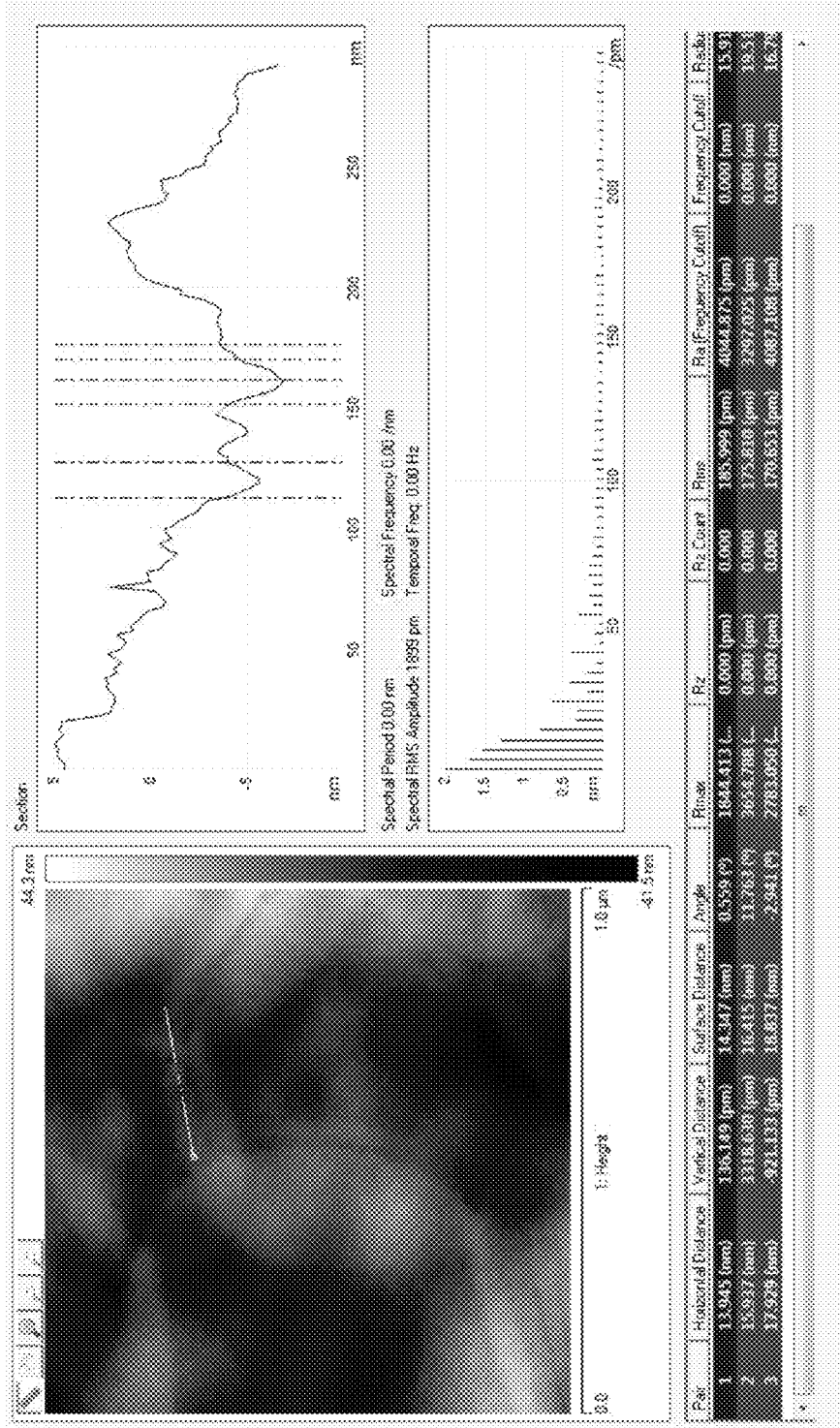

The significant structures difference from figures shown above are the SAM fabricated by added o-NPA in the mixture of mM-β-DMCD, T-CD, PEG and PVP, that formed a flat bridge with nanopores. FIG. 2A shows the flat bridge with width 330 nm and length in 1.4 µm by cross section analysis with RMS 0.6 nm in the image. Nanopores can be seen on each side of the bridge; the pores on the left side of the bridge have a depth 0.3-0.8 nm and diameter 20-30 nm. FIG. 2B shows the membrane morphology specification in thickness 60.2 nm with the roughness 15.1 nm. FIG. 2C shows the pore size having 14-16 nm diameters on the right hand side of the flat bridge with the pore depth 0.1-2.3 nm by the cross-analysis AFM. The RMS value is 0.8 nm in a small scale view window of 500×500 nm. FIG. 2D is the AFM results of FIG. 2C with the pores in the membrane thickness 55.8 nm. FIG. 2E depicts the body of the horizontal flat bridge was densely covered with thousands uniformly and orderly orientated donuts shaped "fish scales", density of $10^7$ pores/cm$^2$, with the average donuts size of 22 nm in diameter and the pores in the center are 9-10 nm in diameter shown in FIG. 2E. FIG. 2F shows the AFM image of the "breathing pore" near the flat cross bridge with the pore length among 12-18 nm and the vertical pore depth is 0.1-3.0 nm and the RMS is 0.18 nm by the cross section analysis. FIG. 2G shows the AFM results with pores presence with the membrane thickness 157 nm and the membrane roughness is 12.5 nm.

Example 3

Fabrication of the Au/SAM Nano-Island Membrane

Figure 3A:
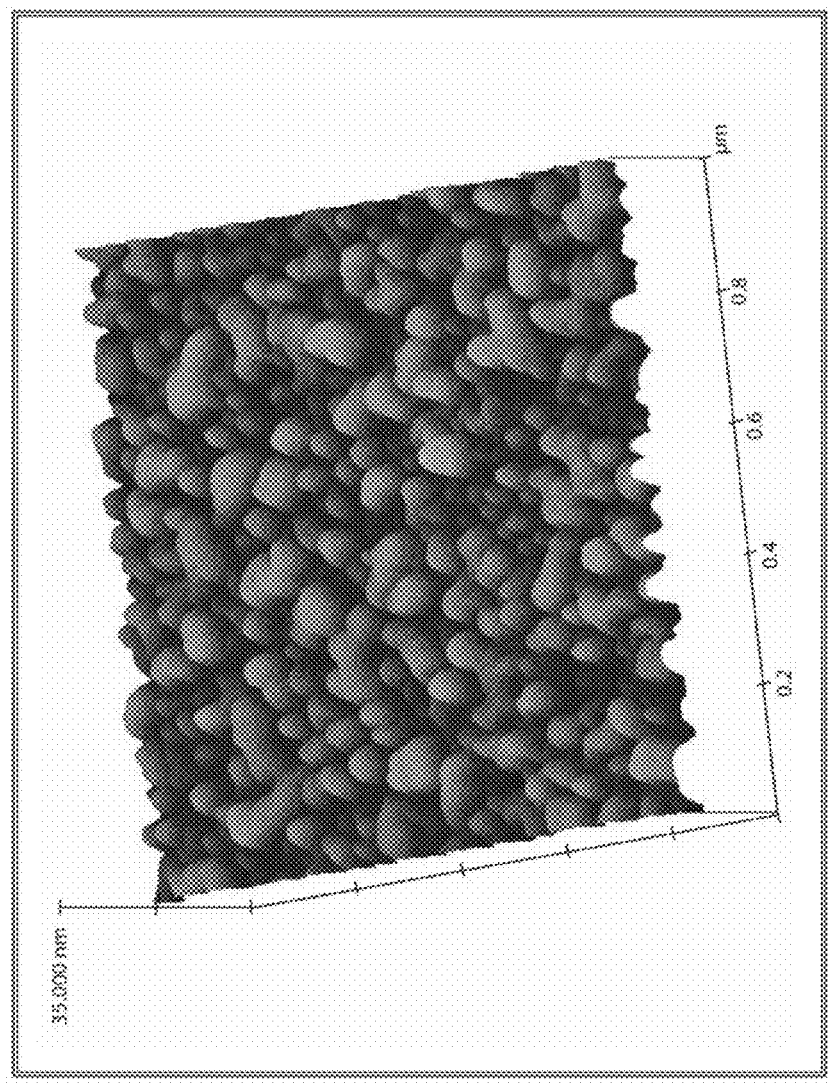
FIG. 3A depicts an AFM images for a Au/MEA with TCD/PVP/PEG/β-CD copolymer with 3D islands structure.
Figure 3B:
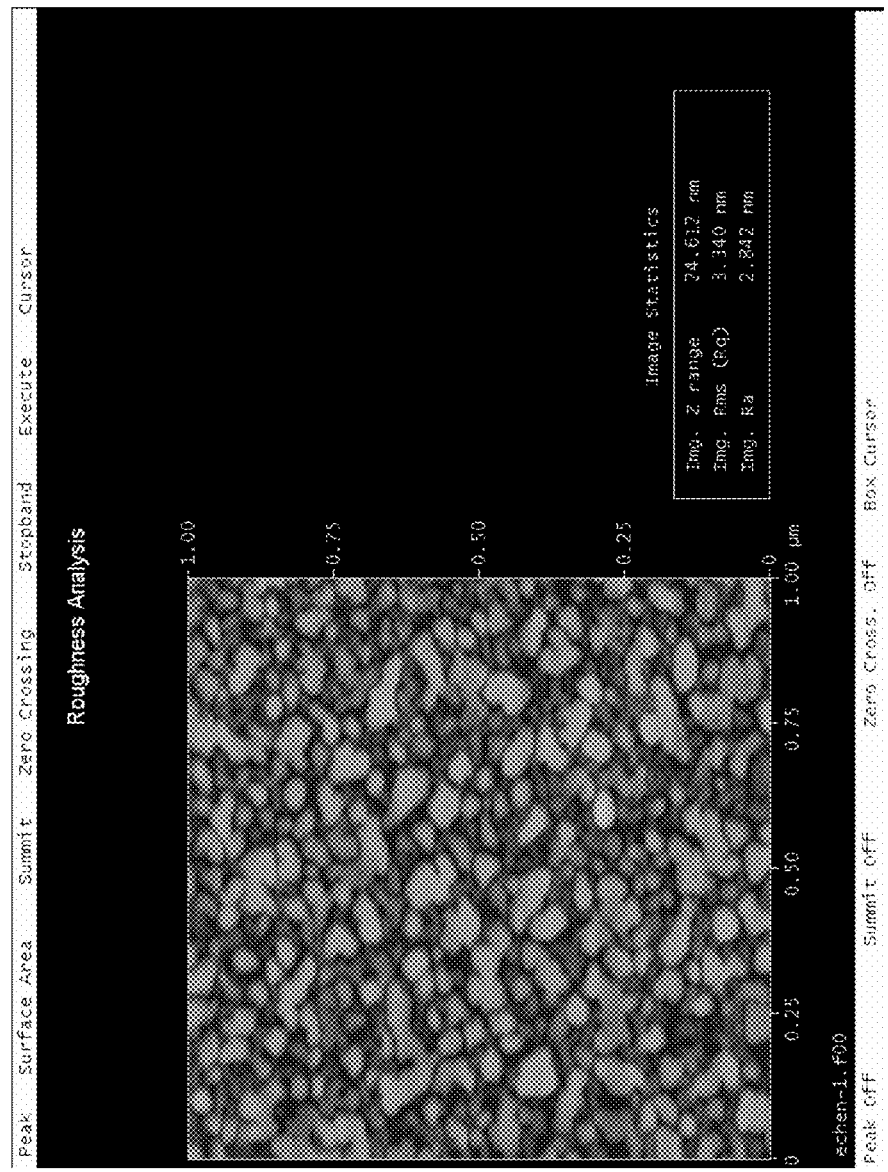
FIG. 3B depicts the AFM images results of Z range, RMS and Ra results.

The nano-island Au/SAM compromised with Au/triacetyl-β-cyclodextrin (T-CD), poly(4-vinylpyridine) (PVP) and Polyethylene glycol diglycidyl ether (PEG)/copolymer β-CD. The procedures of making were disclosed in the U.S. Pat. No. 8,083,926 and the references were included. FIG. 3A depicts the AFM nano-island structure on a pure gold chip and FIG. 3B depicts the membrane thickness is 24.6 nm, the surface smoothness in RMS is 3.3 nm, and the Ra value is 2.84 nm.

Example 4

Mimicking the Active ACHE Gorge and its Linen (Literature is √)

A "Normal Active Site ACHE Gorge" was defined as a linen-cylinder consists of a bipolar dome with two poles. (1): the positive isopotential pole: esteratic site of five residues containing the catalytic triad (Ser-200, Glu-327, His-440), acyl pocket Phe 288 and Phe-290 [6-8], that was mimicked by polyethylene glycol diglycidyl ether (PEG) (for Ser 200) . . . imidazolyl-dimethyl-β-cyclodextrin (M-CD) (for His 440) . . . triacetyl-β-cyclodextrin (T-CD) (for Glu327). Phe288 and 290 were mimicked by o-NPA. (2) The 14 aromatic residues for gorge lining were mimicked by excess amount of o-NPA (1:500-1000 of T-CD/o-nithophenyl acetate (o-NPA)) and W84 were mimicked by poly(4-vinylpyridine) (PVP); (3) the negative isopotential pole: the Asp-72, Tyr-121, Tyr-70, Tyr-354, and Trp-279 are the residues of the peripheral and were mimicked by TCD . . . PEG polymer and TCD . . . PVP polymers as anionic site (PAS), F330, Y121 were mimicked by o-NPA, and Trp279 was mimicked by PVP. By knock out all o-NPA out of the network, we define the second device as "Mutated Active Site ACHE Gorge" based on our hypothesis: Lacking of hydrophobic lining in the gorge might be the key issue caused diseases, because the nature of the ACHE gorge might be mem-ristive, mem-capacitive and mem-inductive in nature. FIG. 4A and FIG. 4B depict the Biomimetic ACHE gorge of a "normal brain" and a "mutated brain" gorges, respectively.

Example 5

Asymmetric Engineering Design of the Organic Memristor/Memcapacitor Devices

Figure 5A:
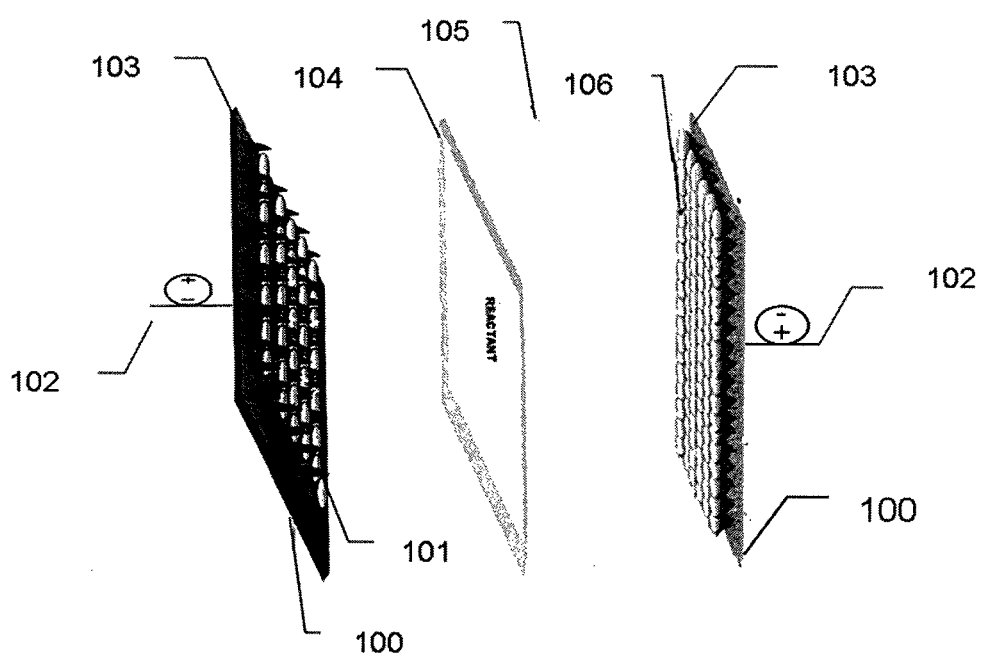
FIG. 5A illustrates the Memcapacitor 1 model as a neuron network of "BHE".
Figure 5B:
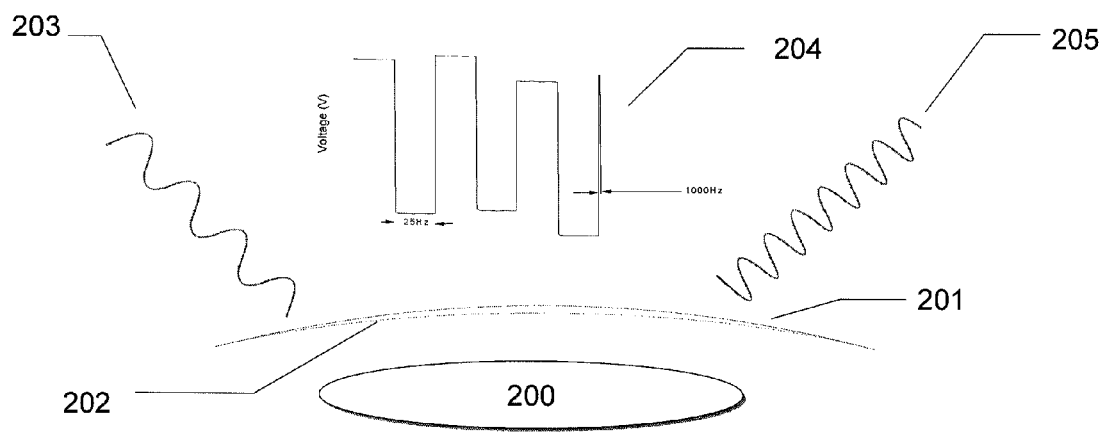
FIG. 5B depicts an example of an arbitrary objet partially covered by the multiple layer curvature memcapacitor membrane that transforms a low frequency electric wave pulse to a high frequency electric wave pulse by the embedded Low-To-High Frequency Switch inside of the memcapacitor.
Figure 6:
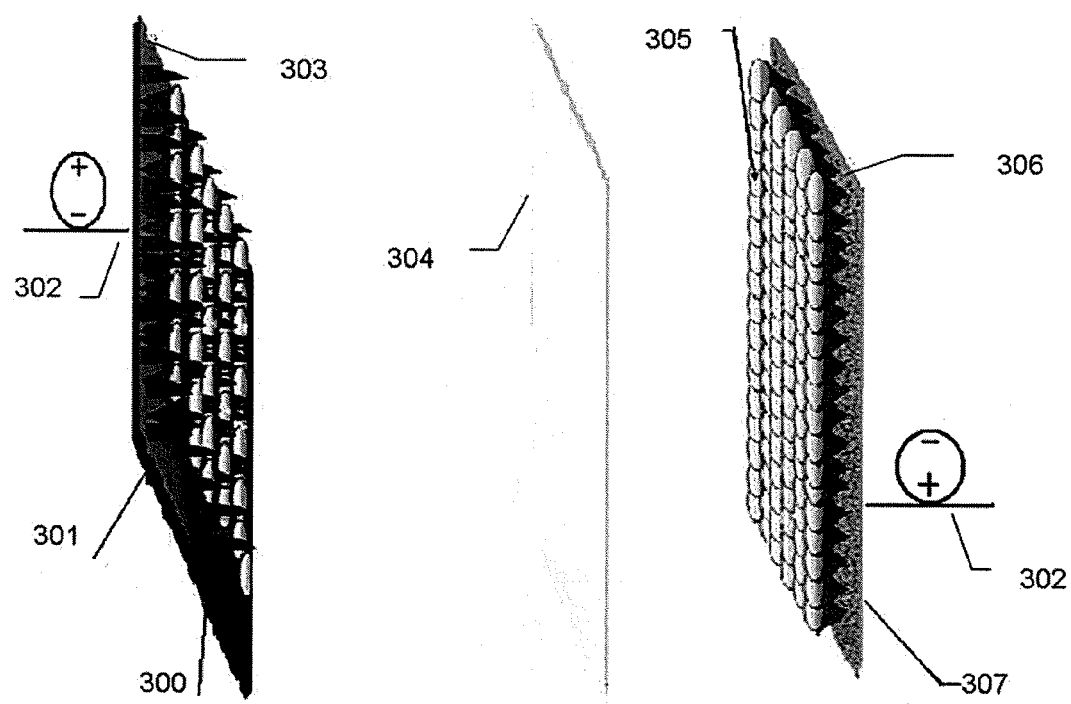
FIG. 6 depicts Memcapacitor 2 as a neuron network for the "Predator".

The morphology of the AU/SAM was characterized using an Atomic Force Microscope (AFM) (model Multimode 8 ScanAsyst, Bruker, Pa.). Data Collected in PeakForce Tapping Mode. Probes used were ScanAsyst-air probes (Bruker, Pa.) and the nanostructured SAMs were published in literature [21]. An asymmetric design for the biomimetic ACHE neuronal memristor/memcapacitor of BHE mimicking fish was illustrated in FIG. 5A and the mimicking predator catfish of the memristor/memcapacitor was depicted in FIG. 6. In FIG. 5A, "100" refers to the polymer plastic substrate, "101" refers to the nano islands structured MEA conductive polymer membrane, "102" refers to the switchable lead, "103" refers to the gold electrode, "104" refers to the reactant polymer lid, "105" refers to the insulator, "106" refers to another MEA with a flat bridge/nanopore structured conductive membrane. FIG. 5B depicts an example of an arbitrary object partially covered by the multiple layer curvature memcapacitor membrane that transforms a low frequency electric pulse to a high frequency electric pulse by a Low -To-High Frequency Switch embedded inside of the memcapacitor. "200" refers to an object, "201" refers to the multiple layer curvature memcapacitor membrane surface configuration shown in FIG. 5A, "202" refers to the signal-cloaking partially covers the object, "203" refers to the low frequency electric pulse as human or fish possessed, "204" refers to the wave modulation in spontaneous voltage pulse diverging discharges over 25 Hz-1 KHz frequency in 1 M methanol at room temperature, "205" refers to the high frequency electric pulse discharged in the mamcapacitor making the object undetectable. FIG. 5A was defined as "BHE fish" as shown in FIG. 7A, and it consists of a nanoisland self-assembling Membrane (SAM) Au/triacetyl-β-cyclodextrin (T-CD), poly(4-vinylpyridine) (PVP) and Polyethylene glycol diglycidyl ether (PEG)/copolymer β-CD as one Membrane Electrode Assembling (MEA) separated by a insulator and connected with another MEA of Au. The monoimidazolyl derivative dimethyl β-cyclodextrin (M-CD)/TCD/PVP/PEG/embedded with o-nitrophenyl acetate (o-NPA) through Pt current collectors at two ends. The insulator absorbed 1M methanol as model 1. The Atomic Force Microscopy (AFM) images and membrane fabrication methods were reported in literature [8, 20]. An asymmetric design for the Biomimetic "Predator Fish", the Catfish, shown in FIG. 7B. The memcapacitor consisted of Au/MCD/TCD/PVP/PEG with structure of vertical bridge/ nanopore MEA separated by an insulator and connected with a Au/MCD/TCD/PVP/PEG embedded with o-NPA forming flat bridge/nanopopore memcapacitor as model 2 shown in FIG. 6, that "300" refers to the vertical bridge/nanopore membrane, "301" refers to polymer substrate, "302" refers to the switchable lead, "303" refers to the gold electrode, "304" refers to the insulator, "305" refers to the flat bridge/nanopore membrane, "306" is the same gold electrode as "303", "307" is the same polymer substrate as in "301". The AFM images were reported in literature 20.

Example 6

Characteristics of the Memristors

Memristor's characteristic i-V curves and the diverging frequency were studied using CV method at 20 mV/s scan rate in room temperature. Memristors are devices made of nanolayers that have the capability to mimic neuronal synapse with a characteristic of hysteresis loop in the i-V curve [22-26]. A memristor is a semiconductor whose resistance varies as a function of flux and charge. This allows it to "remember" what has passed through the circuit [22-26]. G({x},t) which is state dependent $$I(t)=G(\{x\}, V, t)V(t) \quad (1)$$

Figure 8:
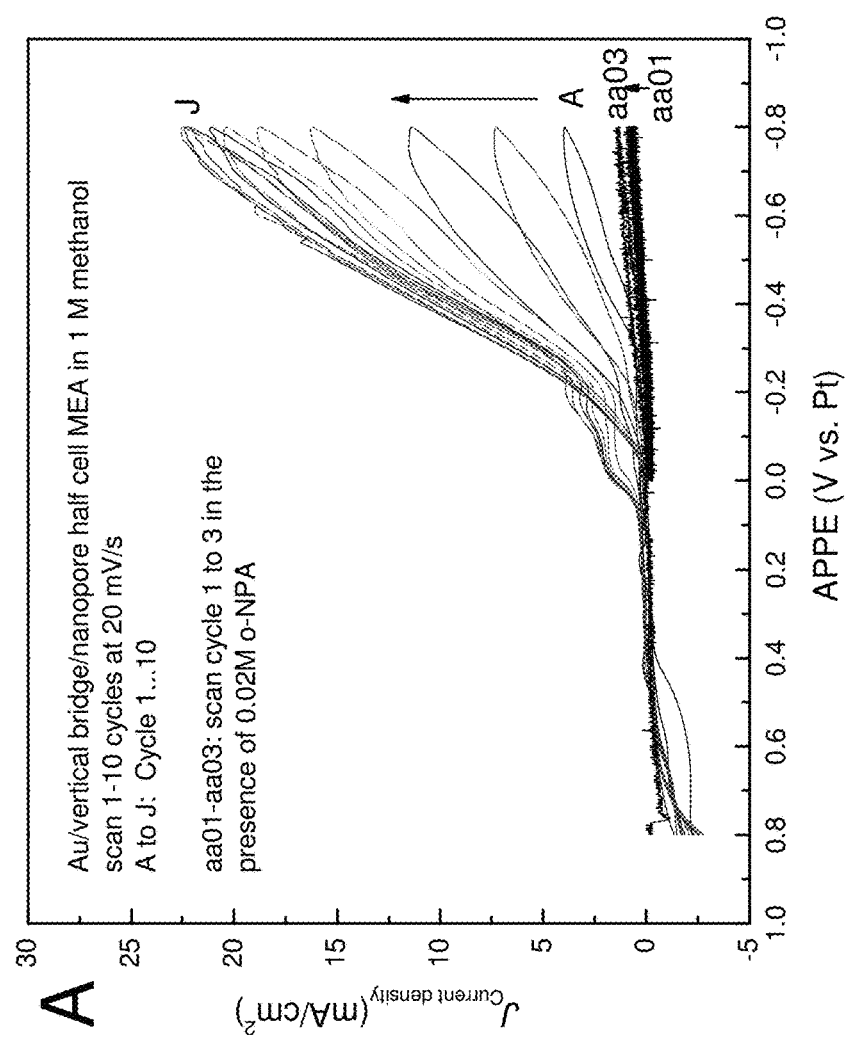
FIG. 8 depicts the AU/"vertical nanopore"/Pt half cell MEA with 10 cycle as curves from A to J with scan rate 20 mV/s and the switch cross-point in 1 M methanol compared the curves in the presence of 0.02M o-NPA in 1M methanol from aa01 to aa03.
Figure 9:
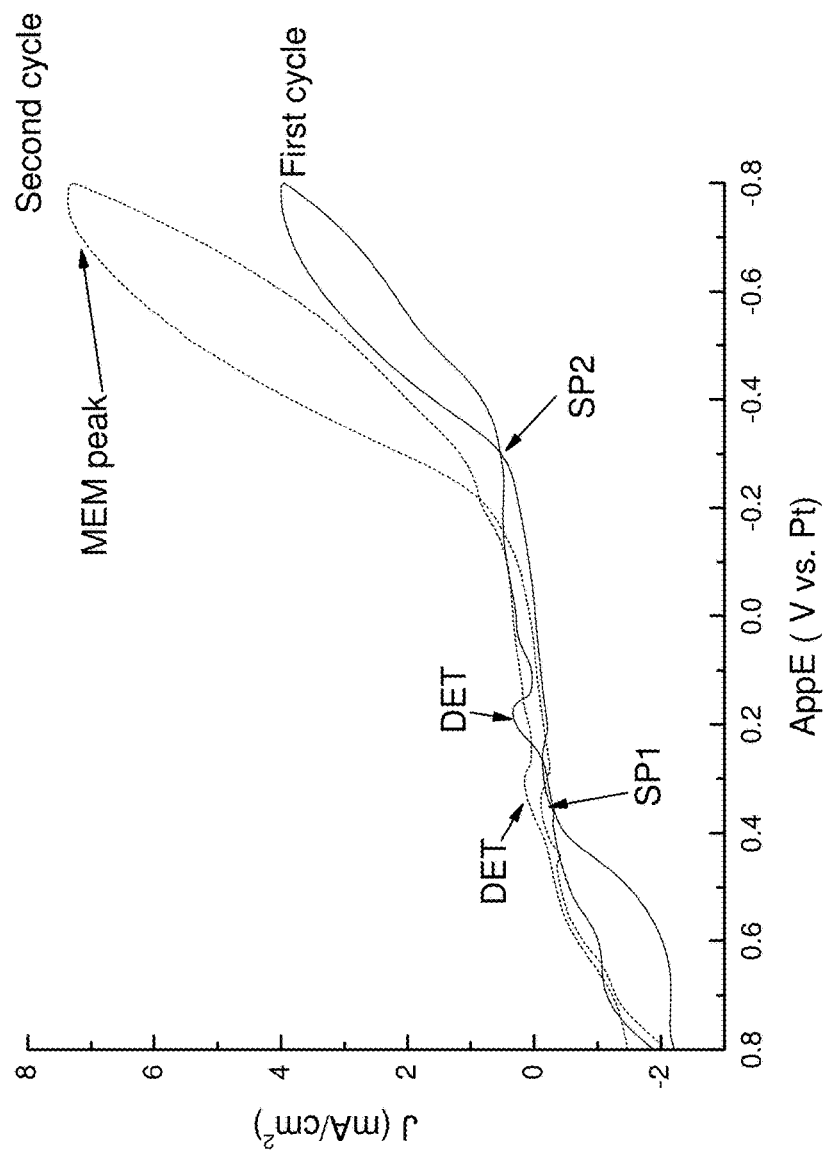
FIG. 9 illustrates the DET peak and the switch point (SP) signed from the first and second cycle in FIG. 8 and signed the DET peak and the Sp locations.
Figure 10:
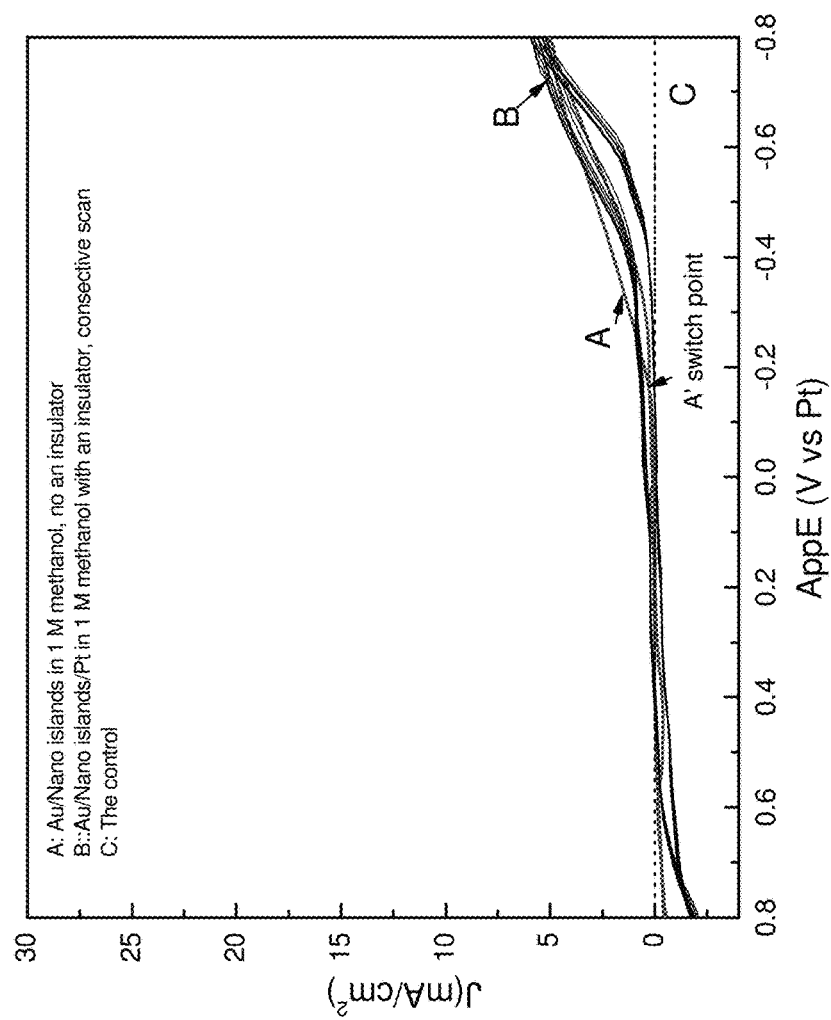
FIG. 10 depicts the half cell of Au/nano-island/Pt MEA with an insulator (black) as "A" for consecutive scans, and the half cell without an insulator (red) as B in 1M methanol, scan rate 20 mV/s at room temperature.

The normal ACHE neuronal BHE Device 1's hysteresis i-V profiles measured by the cyclic voltammetry (CV) method are presented in FIG. 8, the Au/mutated ACHE gorge with "vertical bridge/nanopore" MEA-insulator/Pt half cell's peak increased dramatically over curves "a" to curve "j" as the total scan time increased over the 10 cycles and the DET peak and the switch point (SP) are signed for the first 2 cycles as shown in FIG. 9. In contrast, when o-NPA is present, the current reduced to zero from curve aa01 to aa03 shown in FIG. 8, that indicates o-NPA played a role in the event. The i-V curves were switched and the DET peaks were observed. In FIG. 10 the red line shows the typical memcapacitor i-V curve with a switch point near −0.2V, and the half cell of Au/nano island-insulator/Pt has a quarter of the peak intensity compared with that in FIG. 8. The memristor's switch point was observed in the red line without an insulator. The exponential increase of the current in FIG. 11 may be caused by an abnormal electric field disturbing (17). The prefect hysteresis loops in the presence o-NPA and ACH using memristor #2 was observed in our report [21].

Data Acquisitions were conducted by connecting the memristor chips with an electrochemical station (Epsilon, BASi, IN) with the BASi software package in the computer. The center circle gold electrode as the working electrode with the Biomimetic membrane attached immersed in the cell culture solution in a vial connected to the anode and a pure Pt electrode without a membrane at one end was connected to the cathode and another end was immersed in the same quiet cell culture solution vial, and the Ag/AgCl reference electrode was immersed in the cell culture solution. Data was collected at a fixed scan rate under an applied electrochemical potential.

Example-6

Circular Current (CC)

Circular current was identified through a continuous scan of each of the half memcapacitor cells for multiple cycles using CV method at a fixed scan rate. From the CV profiles results constructed a 3D contour mapping between the location of Direct Electron Transfer peaks (Z), switch point location (X) and peak current (Y).

Figure 11:
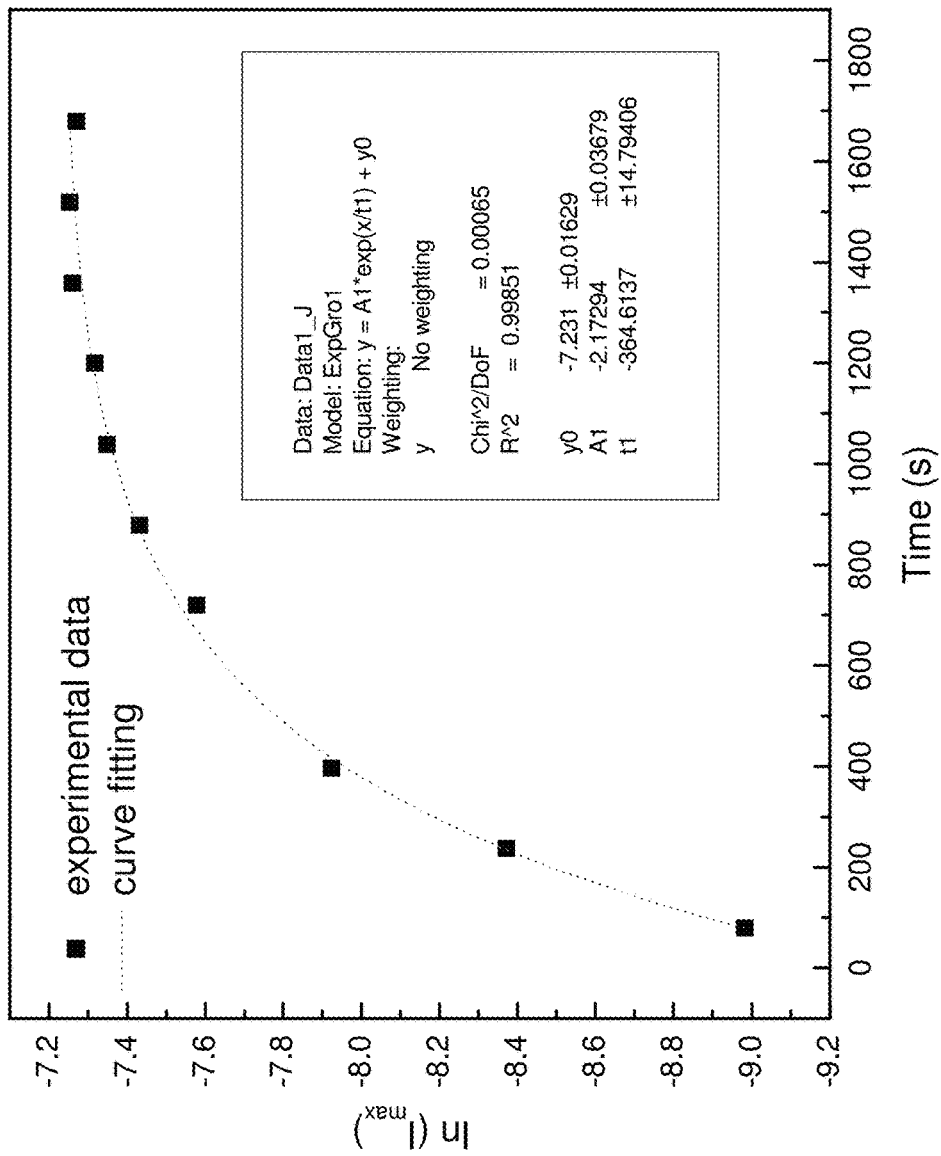
FIG. 11 depicts the plot of current vs. time of the 10 cycle scans as shown in FIG. 9 (curve A to J) of the half cell of Au/"vertical bridge/nanpore" memcapacitor in 1M methanol. The squires are the experimental data and the dotted curve is the fitted data.
Figure 12:
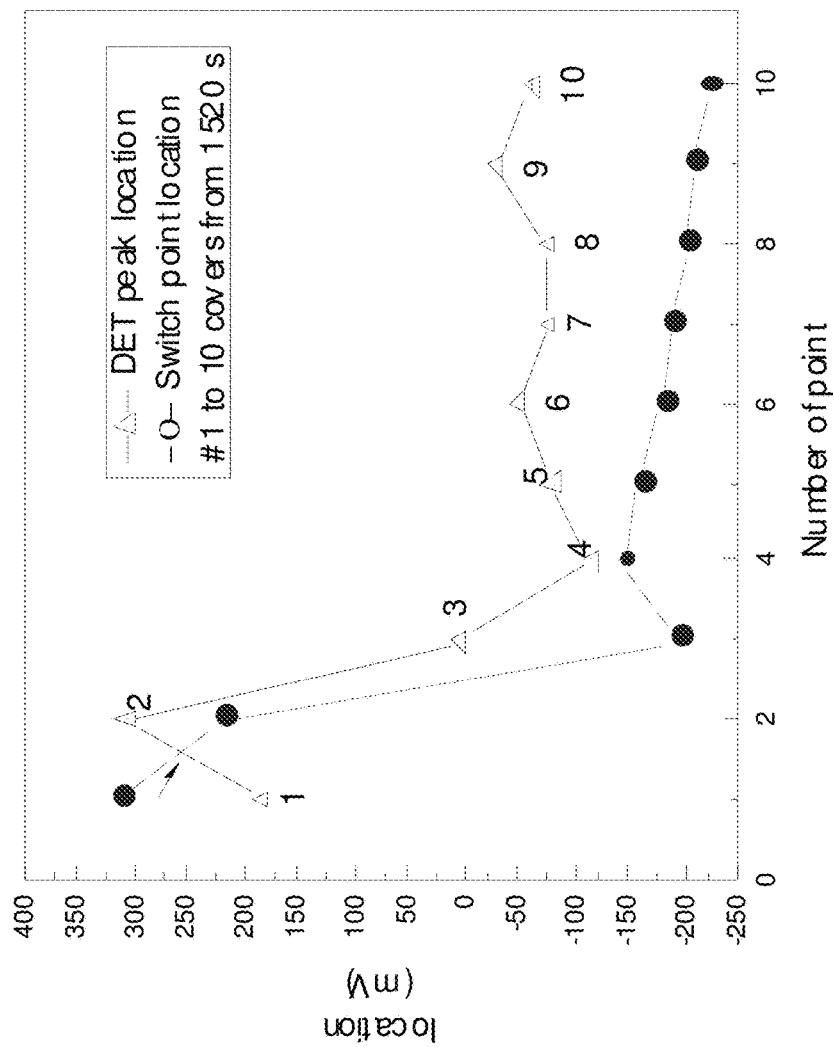
FIG. 12 illustrates the plot of DET peak location and the hysteresis switch point location vs. number of cycles. The triangle represents the DET peak and the circles represent the switch point. The number #1 to #10 represent the time sequence from the first scan to the last scan.
Figure 13:
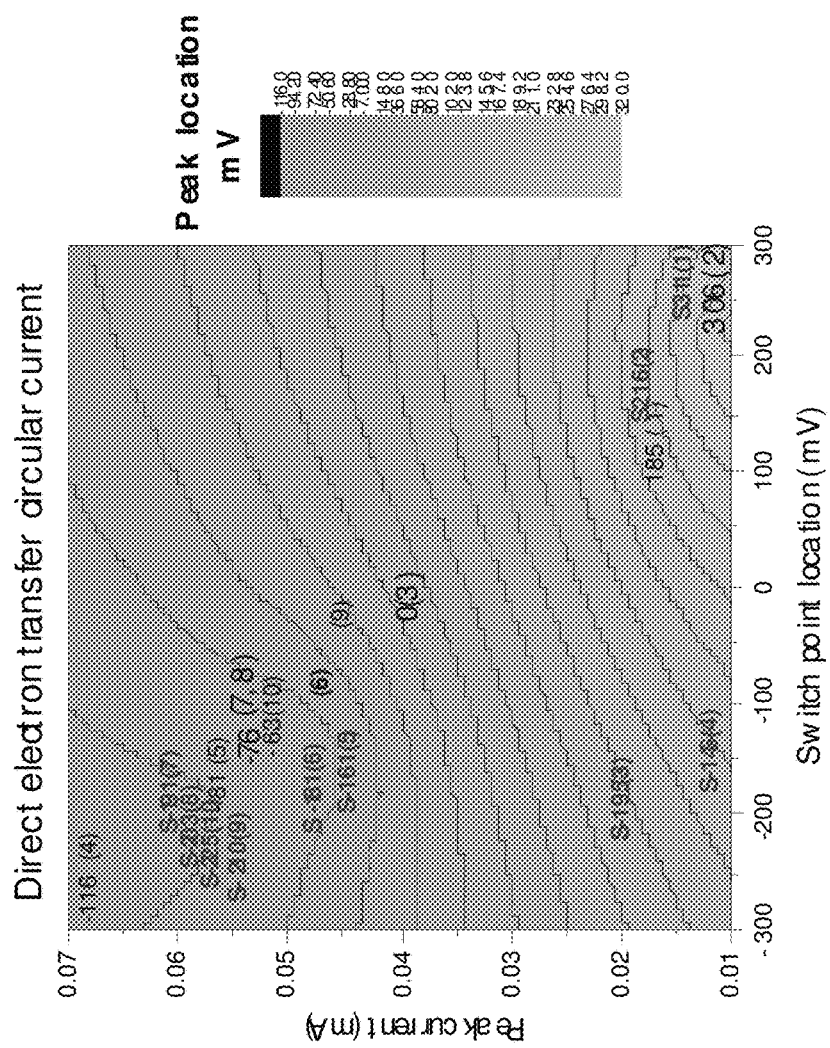
FIG. 13 depicts the contour map between switch point location (X), DET peak current (Y) and the DET peak location (Z).

The exponential increase of the current in FIG. 11 indicates its Schottky diode behavior, i.e., a small potential drop at 0.1V from the origin and then increased nonlinearly that provides higher switching speed and system efficiency [27]. In contrast, CV curves from aa01 to aa03 are flat lines after added 0.02 M o-NPA. The larger peak from "a" to "j" was signed as the diode peak, i.e., here in this invention, refers to the MEM peak, and the peak located near 0.175V was signed as the direct electron transfer (DET) peak in FIG. 9. The observations of CC was shown in FIG. 12 through the plot of current vs. cycle numbers of DET peak and Switch point, respectively. Delocalized electron relay through the multiple residue groups, hydrogen bounding and hydrophobic π-π staking could be the driving force [21]. The heterogeneous surface controlled electron transfer process in terms of DET constant Ks was calculated according to E. Laviron's method at 107/s, and the diode peak is 192.5/s, and it may reach 220.2/s from the vector contributions from our calculation [28-30]. FIG. 13 depicts a 4-demention dynamic contour map of DET peak current as X vs. switch point location as Y and related to DET peak location as Z moving along from first scan cycle data point "1" to last $10^{th}$ cycle data point, the red color associated with the switch point, the blue color associated with the DET, as the fourth dimension W. The map clearly demonstrates a disturbance of the CC momentum appearing at the left side corner of the map with both the DET negative electric field location and the switch point location move toward more negative electric potential field associated with higher positive DET peak current, that occupied 70% data (red and blue) against 30% data at which in the switch point at the positive electric potential location, that indicates an eternal power source is pushing the switch point and the DET peak moving uncontrollably until it reached the s-s. It was worthy to mention that only one DET peak associated with the third scan cycle with a switch point at origin, zero mV. The significant 95% all data points are far away from the origin, they were not alignment with origin at the predator memcapacitor, it makes the significant difference from the BHE memcapacitor.

Example-7

Electromagnetic Field Induced by CC

Figure 14A:
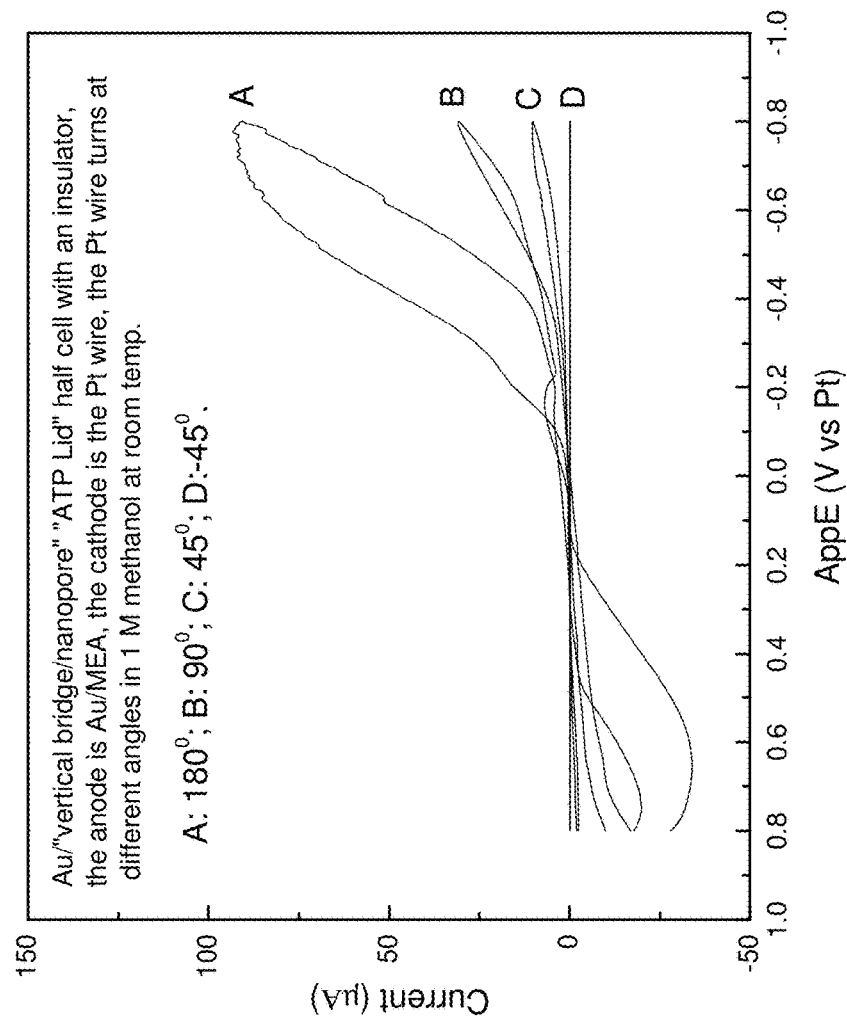
FIG. 14A depicts the AU/"vertical bridge/nanopore" "Predator" memcapacitor i-V profile during horizontally terming the connect angle over 45-180° in 1 M methanol at 20 mV/s scan rate.
Figure 14B:
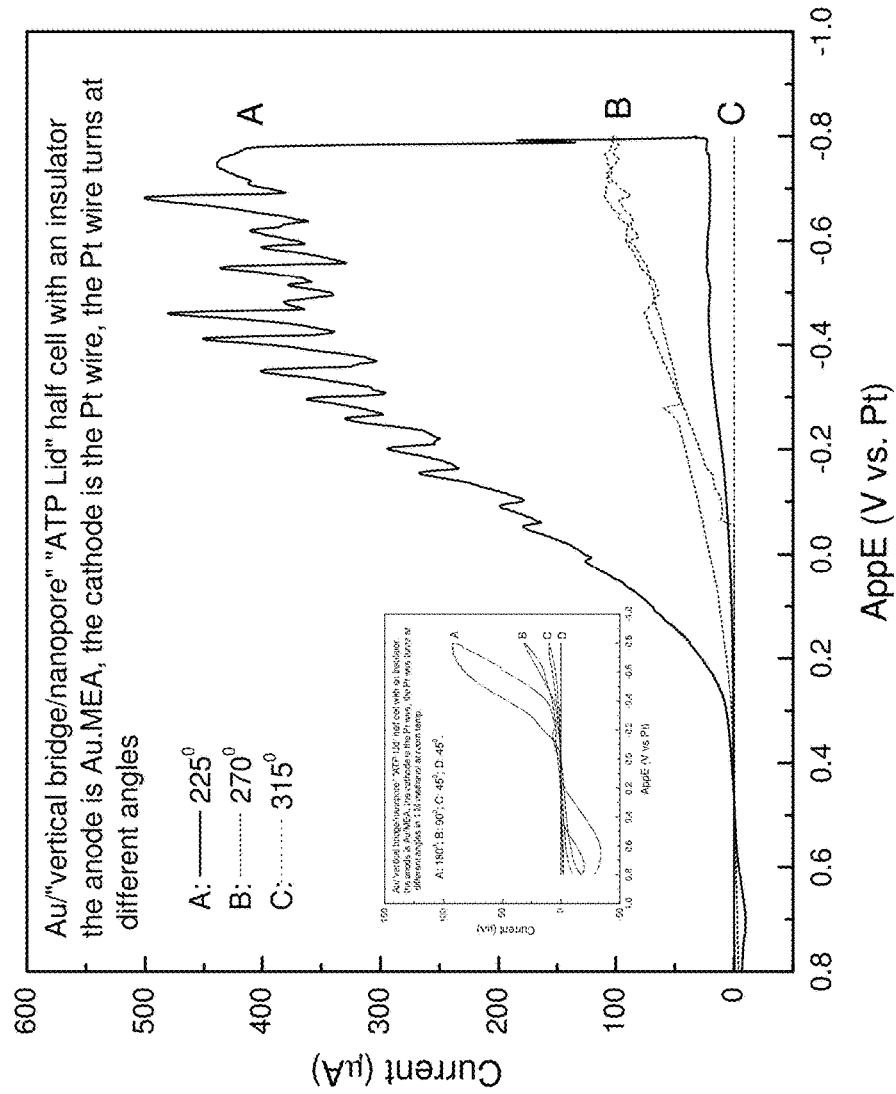
FIG. 14B depicts the AU/"vertical bridge/nanopore" "Predator" memcapacitor has a synchronized peak at 225°, and the insert is the angles change over 45-180° in 1M methanol at 20 mV/s scan rate.
Figure 15:
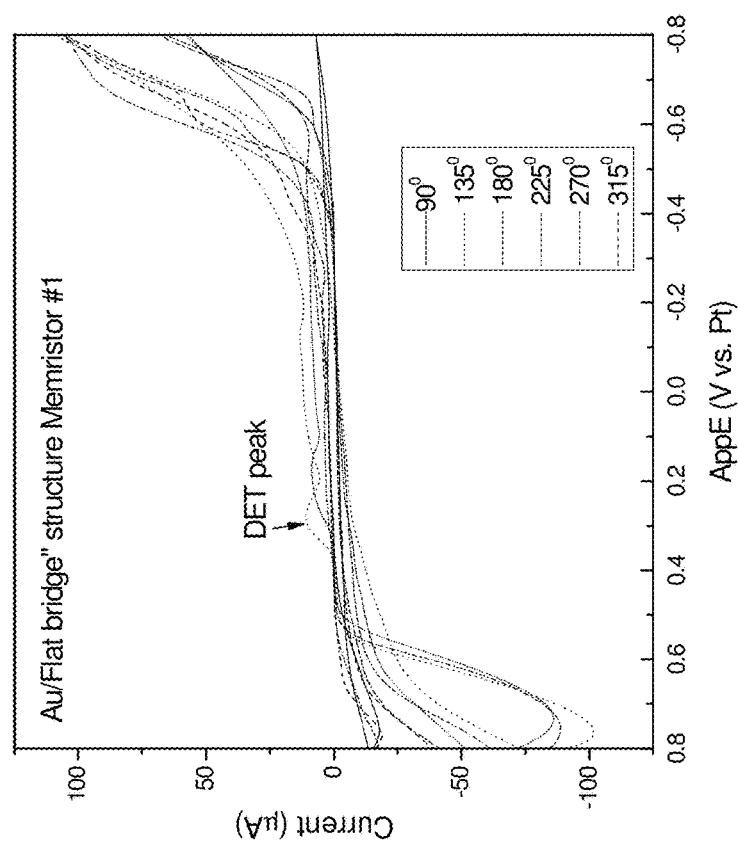
FIG. 15 depicts the i-V curves of AU/normal ACHE gorge with flat bridge/nanopore membrane/insulator/Pt memcapacitor 1 with the hysteresis profiles at different turning angles from 90 to 315° in 1 M methanol.

Evaluation of electromagnetic field induced by CC was conducted by changing the connect angles between the anode separated by an insulator and the cathode (Pt) within the AU/MEA of mutated ACHE vertical bridge/Nanopore cell from 45, 90, 180, 225, 270 to 315° clockwise horizontally in 1 M methanol at room temperature using a CV method at 20 mV/s compared with a AU/MEA of normal ACHE gorge with flat bridge/nanopore membrane as anode separated by an insulator and connected with Pt as cathode as shown in FIG. 14 and FIG. 15 respectively. A modified Biot-Savert equation was used to calculate the overall magnetic field strength at each of the 6 angle changes.

Changing the connect angles between the anode and cathode within the AU/MEA of mutated ACHE gorge with vertical bridge/nanopore from 45, 90, 180, 225, 270 to 315°, induced changes of current reflected in CV curves as shown in FIG. 14A and FIG. 14B that confirmed CC's induction. The largest current is at 225° of 435 µA compared with other angles were much smaller. The total magnitude of magnetic field can be calculated by using the Biot-Savart law [18]:

$$\vec{B} = \vec{B}_{inner} + \vec{B}_{outer} = \frac{\mu_0 I \theta}{4\pi}\left(\frac{1}{a} - \frac{1}{b}\right) \text{(into page)}$$

Consider the current charging loop formed from radial lines and segments of circles whose centers are at point P, a is the inner radius, b is the out radius of the arc. θ is the angle of the current carrying arc. $\mu_0$ is the permeability of free space, and I is current pass the arc. The induced magnetic field values are 0.00736, 0.0465, 0.2852, 1.683, 0.4644 and 0.0514 Tesla, at angles of 45, 90, 180, 225, 270 and 315°, respectively. The overall magnetic field strength induced by switch angels and by circular current can be calculated according to a modified equation:

$$B_{total} = B_c + B_{arc} = \mu_0 NI(2\pi r)^{-1} + B_{arc}$$

The Biot-Savert law, and $B_c$ were defined by Ampere's law. Herein, the highest total value of magnetic field induced is 3.53 Tasla at 225°. The highest total value of magnetic field induced is at 225°. As shown in FIG. 14B, the quick raised current is at the quantum Fermi Resonance point [18] at 225°. This is the first reported instance of an electromagnetic field induced by non ferromagnetic materials. Using NIST's SRM965A human sera at glucose level 2 followed the same procedures applied onto this device, we confirmed the finding. For comparison, FIG. 15 does not have a Fermi Resonance point observed.

Example-8

Embedding a Low-to-High Frequency Switch for Energy Saving

SC behavior was studied using whole memcapacitor cell for the two models at frequencies of 25 and 1000 Hz compared at room temperature. Ratio of action potential at 1 kHz vs. at that of 25 Hz at the head and at the tail was compared for the power saving advantage of SC behavior compared with the two models.

Figure 16:
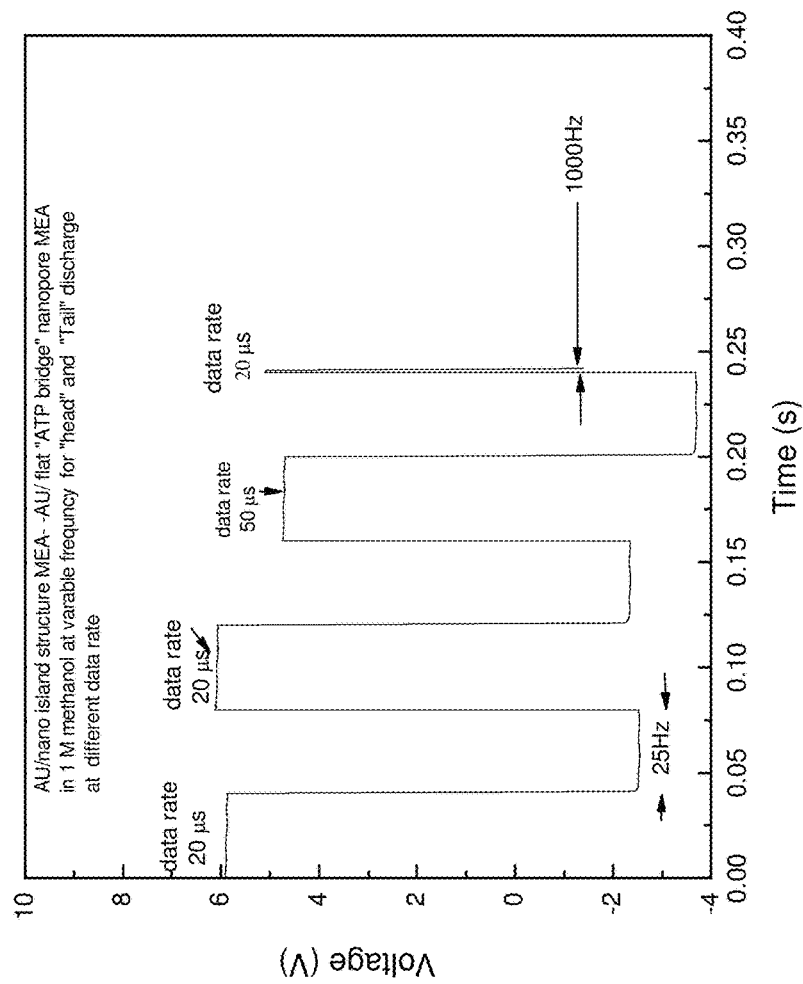
FIG. 16 depicts the "Healthy BHE fish" memcapacitor discharges at diverging frequency over 25 Hz–1 KHz in 1 M methanol at room temperature.
Figure 17:
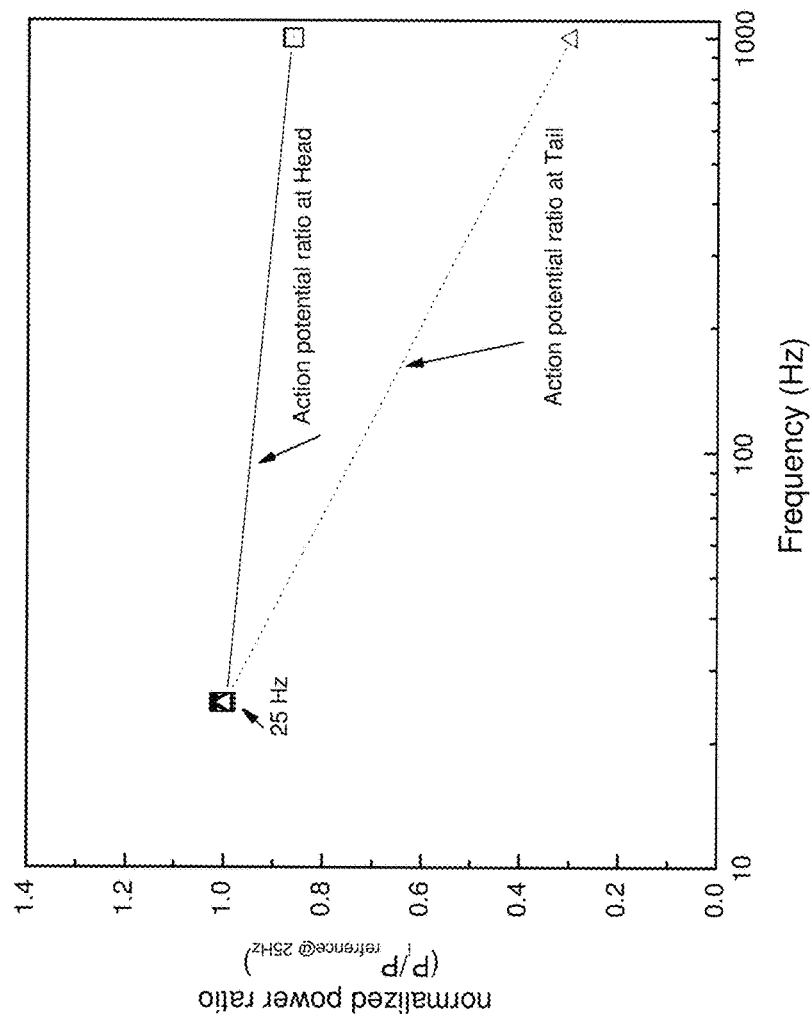
FIG. 17 depicts the BHE device in FIG. 16 has an energy saving from 16% up to 33% for discharge ratio at head and tail at 1 KHz compared with the discharge ratio at 25 Hz, respectively.

BHE fish's flexibility of signal-cloaking jumping from low to high frequency was mimicked by our Biomimetic BHE fish as shown in FIG. 16 from 25 Hz to 1000 Hz, and the energy saving at high frequency was demonstrated in FIG. 17 by 16-33% compared at 25 Hz at head and tail discharge, respectively.

Example-9

Characterizations of Memcapacitor

A total charge of a memcapacitor is a function of a state dependent of capacitance and the potential across it, where q(t) is the total charge on the capacitor, and V(t) is the potential across it. A capacitance C({x}, t) which is state dependent [31].

$$q(t) = C(\{x\}, V, t) V(t)$$

The memcapacitors' charge/discharge energy profiles data acquisitions were conducted by connecting the memcapacitor chips at the two ends separated by a mobile dopant barrier dielectric material. One side of the membrane has structure formed flat horizontal nano-bridges with array larger vertical nanopores underneath the bridge; and another side of the MEA comprising of an electrode/membrane has a negative mobile dopant polymer network forming arrays nano-islands with the membrane thickness is one third of the opposite MEA in order to be feasible conducting "head-tail" biphase discharge at wide range of frequencies as seen in FIG. 5, after that then the cable was connected to an electrochemical station (Epsilon, BASi, IN) with the BASi software package in the computer. The double step chronopotentiometry (DSCPO) method was used to measure the voltage change upon applied a current under ±30 mA with data rate 2 μs at 1 kHz were chosen under the room temperature. The predator memcapacitor device with the same AU/normal ACHE forge with flat horizontal nano-bridges with array larger vertical nanopores underneath the bridge MEA at one end separated by an insulator, but another end MEA was configured with AU/mutated ACHE gorge with vertical array bridge-flat bridge associated with array nanopores connected instead of the nano-island membrane under the same experimental conditions. The real time data was acquainted using the Origin 9.0 software.

Figure 18:
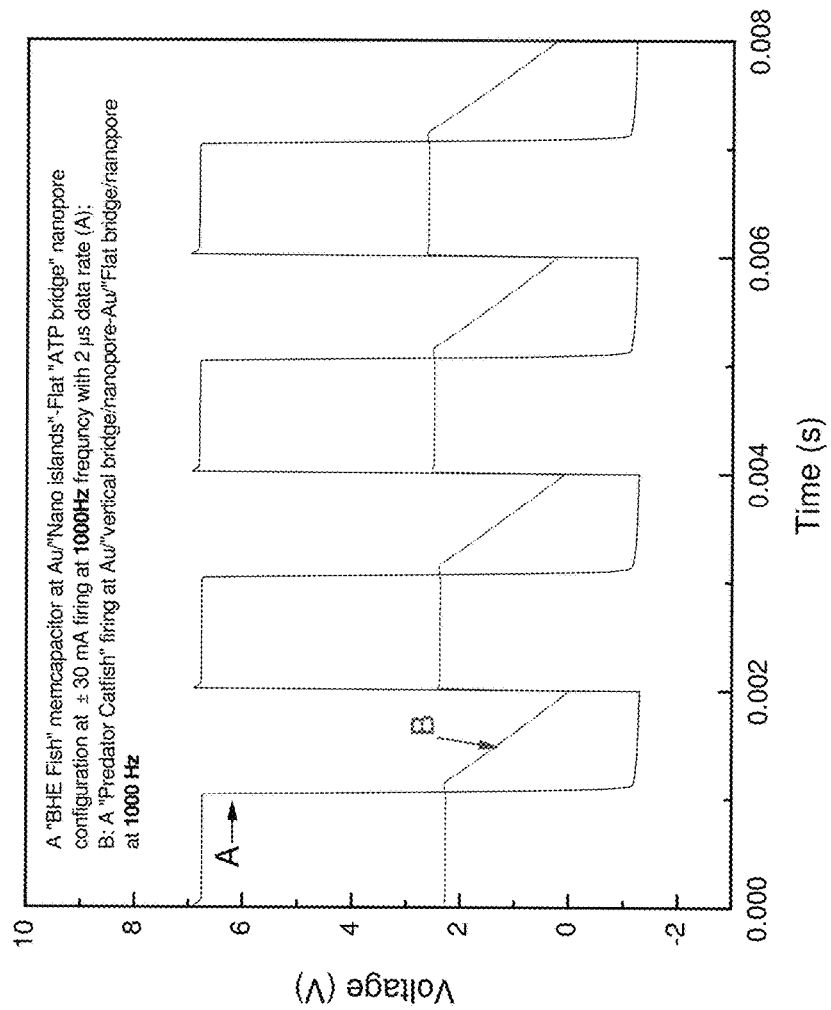
FIG. 18 illustrates the "Predator catfish" discharges at 1 KHz with monophase firing (red) with ±30 mA; but the "BHE fish" can use head-tail biphase firing (black) at 1 KHz under same condition.

FIG. 18 depicts the "Predator catfish" discharges at 1 KHz with monophase firing but the "BHE fish" can use head-tail biphase firing at 1 KHz at ±30 mA.

Figure 19:
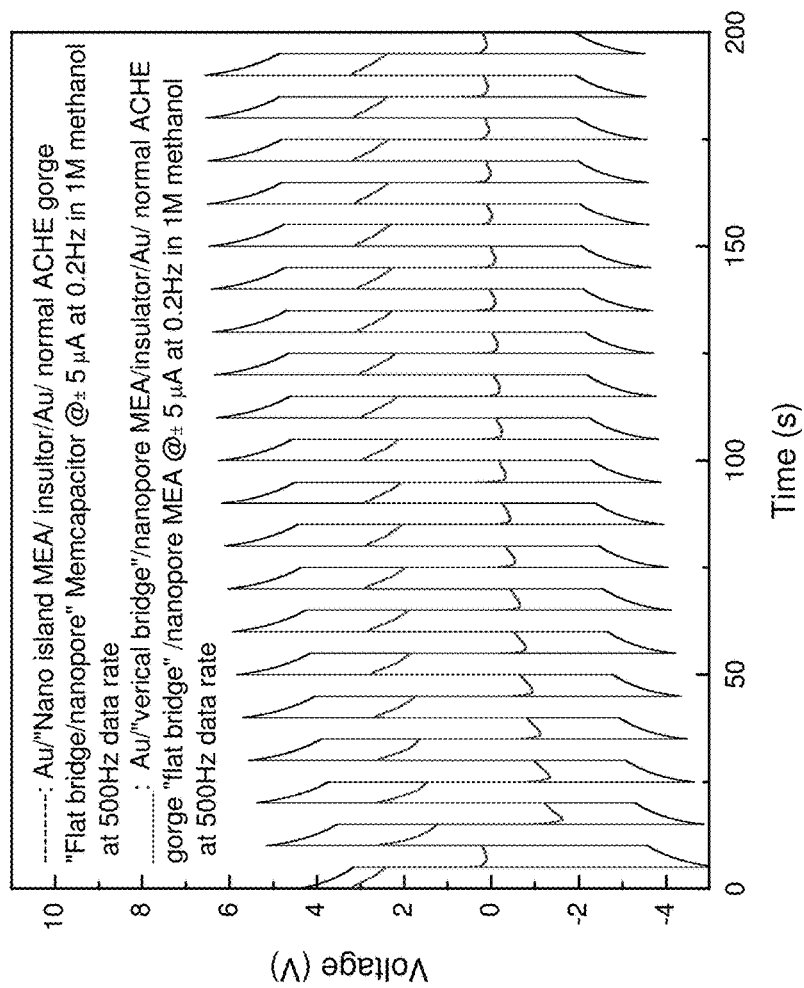
FIG. 19 depicts the comparison of discharge/charge profiles between "BHE" fish (black) and "Predator" fish (red) at Delta SWS (0.2 Hz) in 1M methanol at ±5 µA.

The whole cell synapse profiles during "Slow-Wave-Sleeping" (SWS) at 0.2 Hz at ±5 μA were studied at room temperature in 1 M methanol. The electric synapse profiles between the two memcipacitors were presented in FIG. 19. It is evidenced that the BHE fish has a great declarative memory consolidation with the highest biphase wave intensity than the predator at night.

Example-10

Assessing Stability and Efficiency

Figure 20:
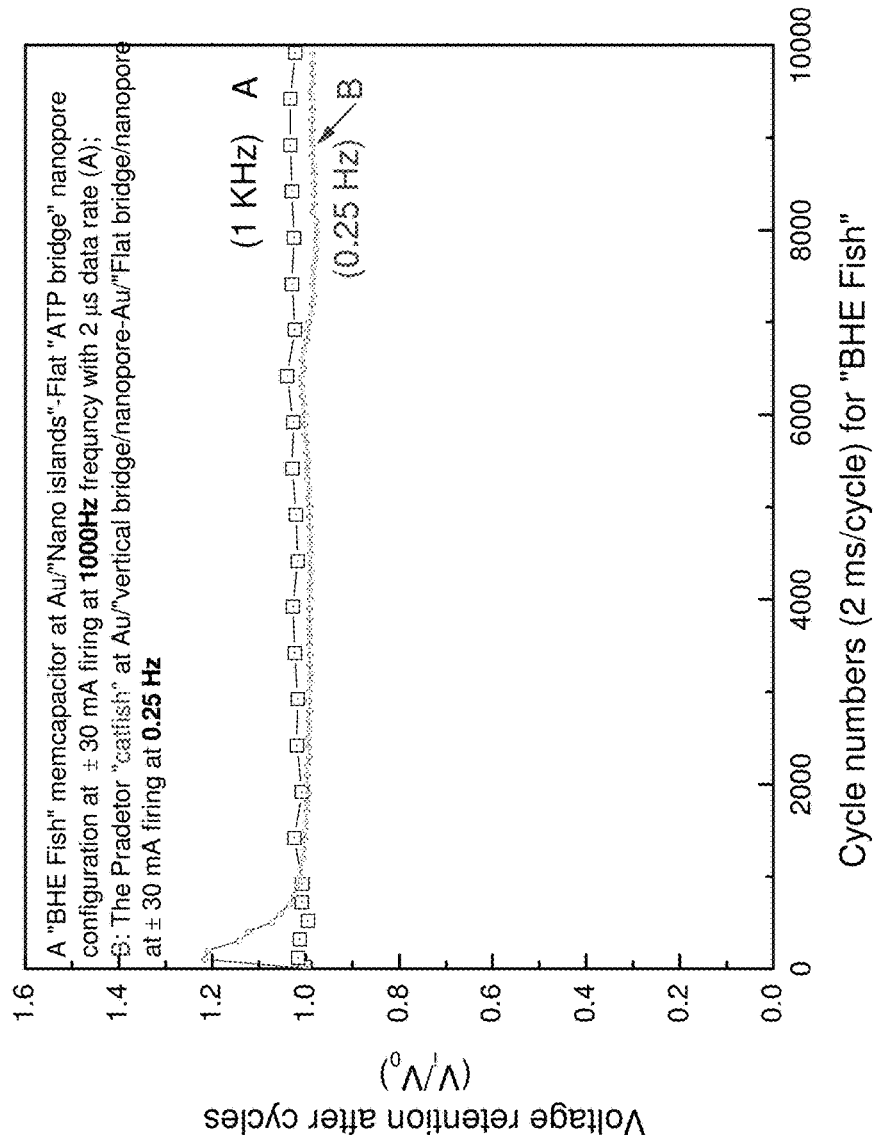
FIG. 20 illustrates the efficiency of the discharge/charge cycle by comparing between the "BHE fish" (black curve) and the "Predator fish" (red curve) over 9999 cycles at ±30 mA at 1 KHz for BHE, 0.25 Hz for the predator fish.

The Double Step Chronopotentiometry (DSCPO) method was used for assessing utility of the newly developed memcapacitors in assessing stability and efficiency of the 9,999 discharge/charge cycles in 1M methanol at ±30 mA using the best performing frequency of 1 KHz for BHE, and best frequency of 0.25 Hz for the predator as shown in FIG. 20. In FIG. 20, the curve A referred to the "BHE fish", it illustrates the stability and efficiency of model 1 memcapacitor for 9,999 cycles firing with 2 ms/cycle at ±30 mA at 1 KHz. It reached an average 100.0±0.01% efficiency against the original starting point (as 100.0) compared with curve B of 98%, except starting several cycles are above 100%. Curve B refers to "predator" had 4 s/cycle at ±30 mA at 0.25 Hz.

Figure 21:
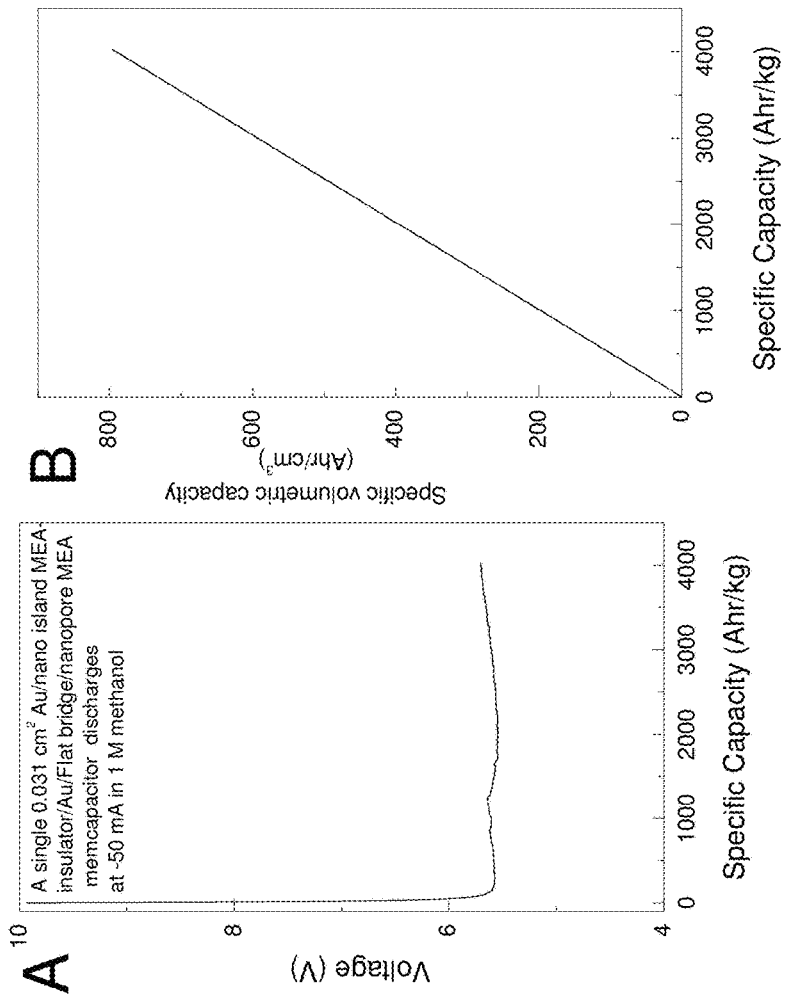
FIG. 21 depicts the memcapacitor model 1 as the "BHE" fish, its discharge profiles of voltage vs. specific capacity at −50 mA in 1 M methanol (A) and the plot of specific volumetric capacity vs. specific capacity of mass (B).

FIG. 21A and FIG. 21B demonstrates the BHE memristor/memcapacitor has capability to effectively discharge energy at −50 mA and store energy, respectively. The specific capacity is up to 4000 Ahr/kg, and the specific volumetric capacity up to 800 Ahr/cm$^3$ for memcapacitor 1. Memcapacitor 1 has current density of 1.6 A/cm$^2$ due to the asymmetric engineering design and the flat bridge/nanopore structured membrane.

Figure 22:
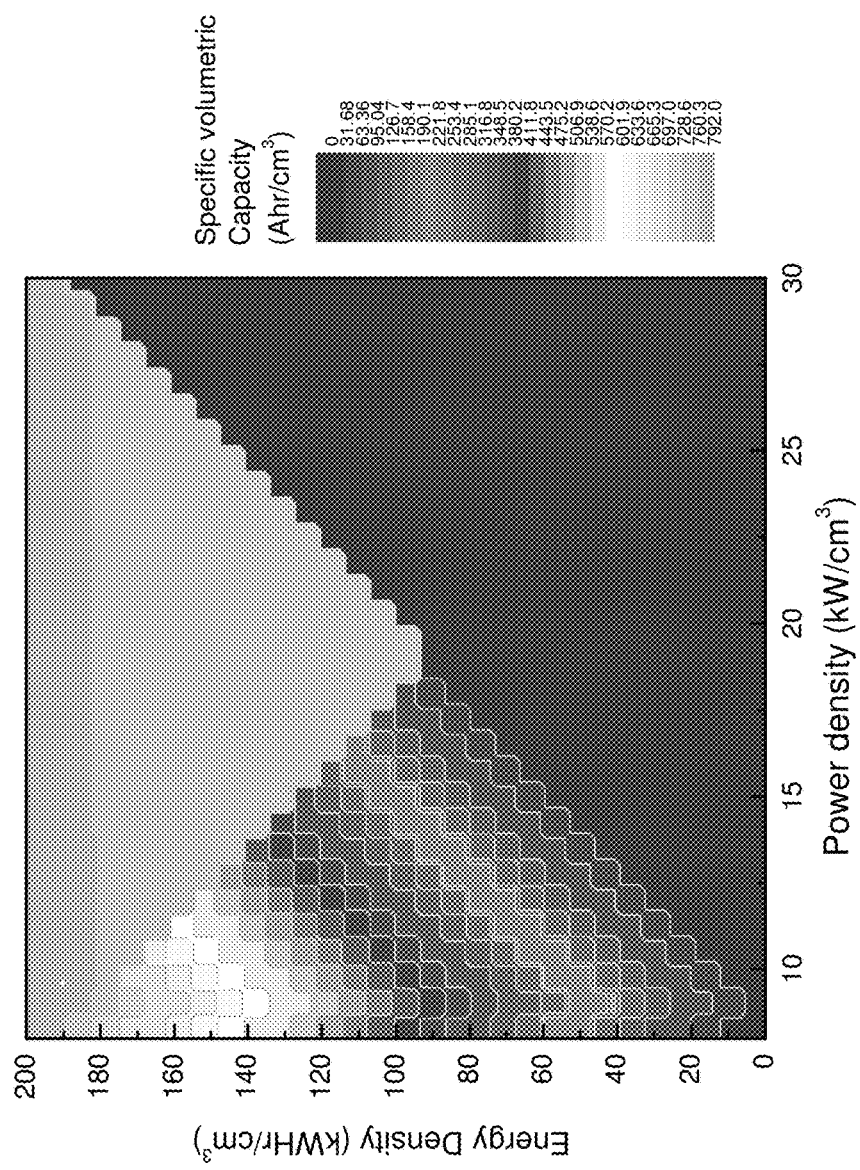
FIG. 22 depicts the contour map of BHE memristor/memcapacitor specific energy density as Y axis vs. Power density as X axis and specific volumetric capacity as Z.

FIG. 22 depicts the contour map between the BHE memristor/memcapacitor energy density vs. power density and the specific volumetric capacity. It demonstrated the highest power density 30 kW/cm$^3$ associated at 200 KWhr/cm$^3$ with 792 Ahr/cm$^3$.

The Biomimetic "BHE fish" avoidance of the "predator" by signal-cloaking was demonstrated.

REFERENCES

1. Stoddard P K and Markham M R, *Signal cloaking by electric fish*, Bioscience, 58(5), 415-425, 2008.

2. Stoddard P K, *Predation enhances complexity in the evolution of electric fish signals*, Nature 400, 254-256, 1999.
3. Herberholz J and Marquart G D, *Decision Making and Behavioral Choice during Predator Avoidance*, Neurosci. 6, 125, 2012.
4. Sussman J L, Harel M, Frolow F, Oefner C, Goldman A, Toker L, Silman I, Science 253, 872-879, 1991;
5. Whyte K A, Greenfield S A. Exp Neurol 184,496-500, 2003.
6. Chen E T, Ngatchou C, *An electron-relay prototype supercapacitor mimics electrophorus electricus's reversible membrane potential for a high rate discharge pulse*, Sensors and Transducers J, 15, special, 42-48, 2012.
7. Chen E T, Ngatchou C, *An electron-relay prototype supercapacitor mimics electrophorus electricus's reversible membrane potential for multiple-organ discharge*, Clean Tech, 202-205, 2012.
8. Thornton J T, Christelle C, Chen E T, *Flexible and turnable biomimetic pyruvate dehydrogenase complex (PDC) supercapacitors*, Cleantech, 356-359, 2013.
9. Martinez-Rincon J and Pershin Y V, *Bistable non-volatile elastic membrane memcapacitor exhibiting chaotic behavior*, Electron Devices, IEEE Transactions 58 (6), 1809-1812, 2011.
10. Martinez-Rincon J, Ventra M D, Pershin Y V, *Solid-State memcapacitive system with negative and diverging capacitance*, Physical Review B, 81(19), 195430-1-195430-7, 2010.
11. Pickett M D, Medeiros-Ribeiro G and Williams R S, *A scalable neuristor built with Mott memristors*, Nature Materials, DOI: 10.1038/NMAT3510, 2012.
12. Kozma, Pino R E, Pazienza G E, *Advances in neuomorphic memristor science and applications*, Springer publisher, 2012.
13. Ventra M D, Pershin Y V, *On the physical properties of memristive, memcapacitive, and meminductive systems*, Nanotechnology 24, 255201, 2013.
14. Ohno T, Hasegawa T, Tsuruoka T, Terabe K, Gimzewski J K, *Short-term plasticity and long-term potentiation mimicked in single inorganic synapses*, Nature Materials, 10, 591-595, 2011
15. Yang J J, Strukov D B, Stewart D R, *Memristive devices for computing*, Nature Nanotechnology 240, 2012. DOI: 10.1038.
16. http:en.wikipedia.org, Negative resistance.
17. Martinez-Rincon J, Ventra M D, Pershin Y V, *Solid-State memcapacitive system with negative and diverging capacitance*, Physical Review B, 81(19), 195430-1-195430-7, 2010.
18. Rai D, Hod O and Nitzan A, J. Physical Chemistry Letters, 2, 2118, 2011.
19. Islas R, Heine T and Merino G, Accounts of Chemical Research, 45(2), 215, 2012.
20. Chen E T, *Nanopore structured electrochemical biosensor*, U.S. Pat. No. 8,083,926, Dec. 27, 2011.
21. Chen E T, Thornton J, Ngatchou C, Duh S H, *Nanostructured memristor sensor mimics acetylcholinesterase (ACHE) active sites in the gorge for fM detection of acetylcholine*, NSTi-Nanotech 2014, 2, 200-203.
22. J. Martinez-Rincon and Y V Pershin, Bistable nonvolatile elastic-membrane memcapacitor exhibiting a chaotic behavior, *Electron Devices, IEEE Transactions* 2011, 58 (6), 1809-1812.
23. J. Martinez-Rincon, M D Ventra, Y V Pershin, Solid-state memcapacitive system with negative and diverging capacitance, *Physical Review B*, 2010, 81(19), 195430-195437.
24. M D Pickett, G. Medeiros-Ribeiro and R S Williams, A scalable neuristor built with Mott memristors, *Nature Materials*, 2013, 12, 114-117.
25. M. Suri and B. Desolvo, Advances in neuomorphic memristor science and applications, Editors R. Kozma, R E Pino, G E Pazienza, *Springer publisher*, 4, 2012.
26. M D Ventra, Y V Pershin, On the physical properties of memristive, memcapacitive, and meminductive systems, *Nanotechnology* 2013, 24, 255201.
27. Idea Diode, http:en.wikipedia.org
28. E. Laviron, J. Electroanal Chem., 101, 19-28, 1979.
29. E. T. Chen, J. Thornton, C. Ngatchou, S-H. Duh, P. T. Kissinger, NSTi-Nanotech (3), 115-118, 2013.
30. Chen E T, *first volume, Third Edition*, Lyshevski S E Dekker Encyclopedia of Nanoscience and Nanotechnology, CRC, Mar. 20, 2014.
31. Ventra M D and Pershin Y V, *On the physical properties of memristive and memcapacitive and meminductive systems*, J of Physics D, arXiv:1302.7063v2, 2013.

What is claimed is:

1. An organic memresistor/memcapacitor comprising
(a) a first electrode having an organic conductive membrane on top that made of arrays of nanostructure vertical and horizontal bridges with larger and smaller sized nano truncated cone shape toroid shaped cyclodextrin cavities by self-assembling cross-linked copolymers;
(b) the larger toroid shaped cavities, as nanopore contains different electro-negativity functional groups that mimic the function of acetylcholinesterase (ACHE) and also mimic its active sites in a cylindrical gorge;
(c) the small toroid shaped cavities comprised of at least one or multiple acetyl groups, at least one or multiple imidazole groups and at least one or more hydroxyl groups;
(d) an organic material o-NPA forming a linen lining the larger toroid shaped nanopores in cross bars that is perpendicular to the smaller toroid shaped nanopores and leave nanometer space air gap between them;
(e) a cross-linking polymer PEG and copolymer PVP form the first conductive membrane with cross-bar bridge and nanopore structure;
(f) a second electrode having an organic conductive membrane on top made of arrays of nanostructure vertical islands that compromise of nano toroid shaped cyclodextrin that contains at least one or more acetyl groups and by self-assembling cross-linked with polymer PEG and PVP copolymers.

2. A method of using the organic memresistor/memcapacitor of claim 1 comprising the application of a DC voltage or a DC current across two metal electrode assembies (MEA) separated by an mobile dopant barrier dielectric material such that a changing alternative currents flow in the bipolar ACHE gorge in an electron-relay circular fashion that produces electromagnetism flux with a changing memcapacitance in a hysteresis wave form with on-off switches from low frequency to high frequency.

3. An organic memresistor/memcapacitor according to claim 1, wherein the nano bridges have a width in 330 nm and length in 1.4 pm, and the surface roughness RMS is 0.6 nm.

4. A method of using the organic memreistor/memcapacitor of claim 2, wherein o-NPA is in a concentration ratio between 500-1000:1 in order to build-in an embedded switch device for spontaneous low to high frequency cloaking without auxiliary attached circuitry.

5. A method of using an organic memresistor/memcapacitor of claim 2, wherein the switch can conduct two terminal discharges.

6. A method of using an organic memresistor/memcapacitor of claim 5, wherein the memresistor/memcapacitor with the switch can save energy by lower the energy consumption by 14% and 33% through emitting "head-tail" "EOD" at 1 kHz at 30 mA in 0.031cm2, respectively.

7. A method of using an organic memresistor/memcapacitor of claim 6, wherein the memresistor/memcapacitor with the switch has energy storage performance up to power density 30 kW/cm3, 4000 Ahr/kg, specific volumetric capacity up to 800 Ahr/cm3 and a current density 1.6 A/cm2.

8. A method of using the organic memresistor/memcapacitor according to claim 2, wherein the memresistor/memcapacitor with the low-to-high frequency switch is protected from low frequency caused danger.

9. An organic memresistor/memcapacitor according to claim 1, wherein the biomimetic normal ACHE cylinder gorge with linen has a bipolar dome comprised of a positive pole and a negative pole.

10. A method of using the organic memresistor/memcapacitor according to claim 4, wherein the device is a memresistor with a hysteresis pinch (as called for a crosspoint) switched at zero applied potential and zero current.

11. A method of using an organic memresistor/memcapacitor of claim 10, wherein the device is stable with 9,999 cycles discharge at 2 ms/cycle at ±30 mA at IKHz. It reached an average 100.0±0.01% efficiency against the original starting point (as 100.0).

12. An organic memresistor/memcapacitor of inducing an electromagnetic field comprising of
    (a) the first electrode having an organic conductive membrane on top that made of arrays of nanostructure vertical and horizontal bridges with smaller ad larger toroid shaped cyclodextrin, by self-assembling cross-linked copolymers;
    (b) the larger toroid cavities contain different electronegativity functional groups that mimic the function of acetylcholinesterase (ACHE) and also mimic its active sites in the cylindrical gorge;
    (c) the smaller hollow toroid shaped cavities comprise at least one or multiple acetyl groups, at least one or multiple imidazole imidazole groups and at least one or more hydroxyl groups;
    (d) cross-linking polymer PEG and copolymer PYP form the first conductive membrane with cross-bar bridge and nanopore structure;
    (e) an organic material o-NPA forms a linen lining the larger toroid shaped cyclodextrin in cross bars perpendicular to the smaller toroid shaped cyclodextrin with nanometer space air gap between them;
    (f) The second electrode having an organic conductive membrane on top made of arrays of nanostructure tall vertical bridges and horizontal bridges that compromise toroid shaped cyclodextrin contains at least one or more imidazole groups, at least one or more acetyl groups, hydroxide groups forming lattice shape membrane by self-assembling cross-linked with polymer PEG and PVP copolymers;
    (g) with a lack of hydrophobic reagent o-NPA in the ACHE gorge membrane associated with the second electrode to lock active sites in place, the second electrode associated membrane is unstable except upon application of a DC voltage cross the second MEA separated by an mobile dopant barrier dielectric material and connected with a bare Pt electrode having no membrane on it in 1M methanol, when turning the terminals horizontally in various angles, a phenomena was recorded, that a drastic exponentially increase currents flow occurred in the bipolar ACHE gorge with an electron-relay circular fashion that produces electromagnetism flux at the quantum Fermi Resonance point;
    (h) the memresistor/memcapacitor device cannot biphasic symmetric discharge at 30 mA at high frequency, hence it lacks of the opportunity to make low-to-high frequency switch and consumes more energy than the BHE device;
    (i) The memresistor/memcapacitor device having a bridge vertical height between 47.3-51.5 nm with the length of 940 nm and the horizontal bridge width is 200-600 nm and height is 44.4 nm, and length is 1100 nm through the AFM section analysis compared with the BHE memresistor/memcapacitor device's horizontal bridge width in 330 nm and length in 1.4 pm with a depth of 60.2 nm and the vertical pores oriented on the gold chip with a height of 3 nm and pore diameter 12-18 nm by cross section analysis and for the BHE device, the 3D lattice between the flat bridge and the top rim of the surface of the pores has air gaps of 40-56 nm.

13. The memresistor/memcapacitor according to claim 12, wherein the device has a DET Ks constant is 107/s, and the diode peak Ks constant is 192.5/s, and may reach 220.2/s.

14. The me resistor/me capacitor of claim 12, wherein the device induced magnetic field values are 0.00736, 0.0465, 0.2852, 1.683, 0.4644 and 0.0514 Tesla, at angles of 45, 90, 180, 225, 270 and 315°, respectively in the absence of ferromagnetic material based on a disturbed CC current.

15. The memresistor/memcapacitor device of claim 14, wherein the device may be incorporated into devices including medical devices, military devices, transportation devices, and energy devices.

16. The memresistor/memcapacitor of claim 1, wherein the first and the second electrode are made of conductive metal.

17. The memresistor/memcapacitor of claim 16, wherein the conductive metal is gold.

18. A method of using an organic memresistor/memcapacitor of claim 8, wherein the device made low frequency electronic signal emitted by an object invisible through covering the self-assembling membranes on the body of the object with the switch.

19. A method of using an organic memresistor/memcapacitor of claim 18, wherein the switch operates from 0.2 Hz to IKHz of electric power pulse frequency at room temperature.

* * * * *